(12) United States Patent
Li

(10) Patent No.: US 10,418,595 B2
(45) Date of Patent: Sep. 17, 2019

(54) DEVICES, STRUCTURES, MATERIALS AND METHODS FOR VERTICAL LIGHT EMITTING TRANSISTORS AND LIGHT EMITTING DISPLAYS

(71) Applicant: Atom Nanoelectronics, Inc., Los Angeles, CA (US)

(72) Inventor: Huaping Li, Los Angeles, CA (US)

(73) Assignee: Atom Nanoelectronics, Inc., Los Angeles, CA (US)

( * ) Notice: Subject to any disclaimer, the term of this patent is extended or adjusted under 35 U.S.C. 154(b) by 0 days.

(21) Appl. No.: 15/244,944

(22) Filed: Aug. 23, 2016

(65) Prior Publication Data
US 2016/0359144 A1 Dec. 8, 2016

Related U.S. Application Data

(63) Continuation of application No. 14/550,656, filed on Nov. 21, 2014, now Pat. No. 9,455,421.
(Continued)

(51) Int. Cl.
*H01L 51/52* (2006.01)
*H01L 51/56* (2006.01)
(Continued)

(52) U.S. Cl.
CPC .......... *H01L 51/5296* (2013.01); *H01L 27/15* (2013.01); *H01L 27/3225* (2013.01);
(Continued)

(58) Field of Classification Search
None
See application file for complete search history.

(56) References Cited

U.S. PATENT DOCUMENTS 5,180,690 A    1/1993  Czubatyj et al.
6,682,863 B2 * 1/2004  Rivers ................. H01L 51/0013
                                              430/200
(Continued)

FOREIGN PATENT DOCUMENTS

CN       108885967 A    11/2018
GB         2562921 A    11/2018
(Continued)

OTHER PUBLICATIONS

Definition of "form," Merriam WebsterrOnline, Retrieved from the Internet on Feb. 20, 2016.
(Continued)

*Primary Examiner* — Hrayr A Sayadian
(74) *Attorney, Agent, or Firm* — KPPB LLP

(57) ABSTRACT

Devices, structures, materials and methods for vertical light emitting transistors (VLETs) and light emitting displays (LEDs) are provided. In particular, architectures for vertical polymer light emitting transistors (VPLETs) for active matrix organic light emitting displays (AMOLEDs) and AMOLEDs incorporating such VPLETs are described. Porous conductive transparent electrodes (such as from nanowires (NW)) alone or in combination with conjugated light emitting polymers (LEPs) and dielectric materials are utilized in forming organic light emitting transistors (OLETs). Combinations of thin films of ionic gels, LEDs, porous conductive electrodes and relevant substrates and gates are utilized to construct LETs, including singly and doubly gated VPLETs. In addition, printing processes are utilized to deposit layers of one or more of porous conductive electrodes, LEDs, and dielectric materials on various substrates to construct LETs, including singly and doubly gated VPLETs.

10 Claims, 13 Drawing Sheets

Related U.S. Application Data

(60) Provisional application No. 61/907,324, filed on Nov. 21, 2013.

(51) Int. Cl.
| | | |
|---|---|---|
| *H01L 51/05* | (2006.01) | |
| *H01L 27/15* | (2006.01) | |
| *H01L 27/32* | (2006.01) | |
| *H01L 33/00* | (2010.01) | |
| *H01L 33/06* | (2010.01) | |
| *H01L 33/24* | (2010.01) | |
| *H01L 33/28* | (2010.01) | |
| *H01L 33/30* | (2010.01) | |
| *H01L 33/32* | (2010.01) | |
| *H01L 33/34* | (2010.01) | |
| *H01L 33/40* | (2010.01) | |
| *H01L 33/52* | (2010.01) | |
| *H01L 51/00* | (2006.01) | |
| *H01L 33/08* | (2010.01) | |

(52) U.S. Cl.
CPC ...... *H01L 33/0041* (2013.01); *H01L 33/0095* (2013.01); *H01L 33/06* (2013.01); *H01L 33/24* (2013.01); *H01L 33/28* (2013.01); *H01L 33/30* (2013.01); *H01L 33/32* (2013.01); *H01L 33/34* (2013.01); *H01L 33/40* (2013.01); *H01L 33/52* (2013.01); *H01L 51/0003* (2013.01); *H01L 51/0004* (2013.01); *H01L 51/0021* (2013.01); *H01L 51/057* (2013.01); *H01L 51/5203* (2013.01); *H01L 51/5237* (2013.01); *H01L 51/56* (2013.01); *H01L 27/3244* (2013.01); *H01L 33/08* (2013.01); *H01L 51/004* (2013.01); *H01L 51/0035* (2013.01); *H01L 51/0036* (2013.01); *H01L 51/0037* (2013.01); *H01L 51/0038* (2013.01); *H01L 51/0043* (2013.01); *H01L 2251/301* (2013.01); *H01L 2251/308* (2013.01); *H01L 2933/005* (2013.01); *H01L 2933/0016* (2013.01)

(56) References Cited

U.S. PATENT DOCUMENTS

| | | | | |
|---|---|---|---|---|
| 6,919,681 | B2 * | 7/2005 | Cok | G09G 3/3216 313/500 |
| 7,253,041 | B2 * | 8/2007 | Gan | H01L 29/4908 257/E21.414 |
| 7,537,975 | B2 | 5/2009 | Moon et al. | |
| 7,907,226 | B2 | 3/2011 | Yang et al. | |
| 7,932,511 | B2 | 4/2011 | Duan et al. | |
| 8,232,561 | B2 * | 7/2012 | Rinzler | B82Y 10/00 257/13 |
| 8,246,928 | B1 | 8/2012 | Rao et al. | |
| 8,512,668 | B2 | 8/2013 | Tanaka et al. | |
| 8,715,607 | B2 | 5/2014 | Liu et al. | |
| 8,940,562 | B1 | 1/2015 | Li | |
| 9,070,775 | B2 | 6/2015 | Chaji et al. | |
| 9,445,421 | B2 | 9/2016 | Levine et al. | |
| 9,455,421 | B2 | 9/2016 | Li | |
| 9,487,002 | B2 | 11/2016 | Rogers et al. | |
| 9,748,439 | B2 | 8/2017 | Li et al. | |
| 2004/0252113 | A1 * | 12/2004 | Vicentini | G02F 1/13452 345/205 |
| 2005/0221016 | A1 | 10/2005 | Glatkowski et al. | |
| 2006/0063460 | A1 | 3/2006 | Seo | |
| 2006/0081844 | A1 * | 4/2006 | Hirosue | H01L 27/12 257/59 |
| 2006/0145144 | A1 | 7/2006 | Lee et al. | |
| 2006/0261433 | A1 | 11/2006 | Manohara et al. | |
| 2007/0246784 | A1 | 10/2007 | Kang et al. | |
| 2008/0008643 | A1 | 1/2008 | Landi et al. | |
| 2008/0023066 | A1 | 1/2008 | Hecht et al. | |
| 2008/0217588 | A1 | 9/2008 | Arnold et al. | |
| 2008/0286447 | A1 | 11/2008 | Alden et al. | |
| 2009/0008634 | A1 | 1/2009 | Tessler et al. | |
| 2010/0103089 | A1 | 4/2010 | Yoshida et al. | |
| 2010/0145062 | A1 | 6/2010 | Li et al. | |
| 2011/0012125 | A1 | 1/2011 | Nicholas et al. | |
| 2011/0036403 | A1 | 2/2011 | Yoon et al. | |
| 2011/0223095 | A1 | 9/2011 | Harvey et al. | |
| 2011/0285951 | A1 | 11/2011 | Yoon et al. | |
| 2012/0062109 | A1 | 3/2012 | Berry et al. | |
| 2012/0104328 | A1 | 5/2012 | Park et al. | |
| 2012/0280213 | A1 | 11/2012 | Gau et al. | |
| 2013/0069043 | A1 | 3/2013 | Friend et al. | |
| 2013/0105770 | A1 * | 5/2013 | Pschenitzka | H01L 31/0232 257/40 |
| 2013/0108793 | A1 | 5/2013 | Sivarajan et al. | |
| 2014/0209997 | A1 | 7/2014 | Qian et al. | |
| 2014/0273379 | A1 | 9/2014 | Tsai et al. | |
| 2015/0102288 | A1 | 4/2015 | Hersam et al. | |
| 2015/0155430 | A1 | 6/2015 | Li | |
| 2015/0202662 | A1 | 7/2015 | Li | |
| 2015/0279919 | A1 | 10/2015 | Zhou et al. | |
| 2016/0043152 | A1 | 2/2016 | Tian et al. | |
| 2016/0126293 | A1 | 5/2016 | Li et al. | |
| 2016/0137854 | A1 | 5/2016 | Heintz et al. | |
| 2016/0280547 | A1 | 9/2016 | Liu et al. | |
| 2016/0380217 | A1 | 12/2016 | Afzali-Ardakani et al. | |
| 2017/0194581 | A1 | 7/2017 | Li | |
| 2017/0213963 | A1 | 7/2017 | Cain et al. | |
| 2018/0148337 | A1 | 5/2018 | Walsh et al. | |
| 2018/0323387 | A1 | 11/2018 | Li | |
| 2018/0323388 | A1 | 11/2018 | Li | |
| 2018/0323406 | A1 | 11/2018 | Li | |
| 2018/0358568 | A1 | 12/2018 | Luan et al. | |

FOREIGN PATENT DOCUMENTS

| | | |
|---|---|---|
| TW | 201734155 A | 10/2017 |
| WO | 2014208896 A1 | 12/2014 |
| WO | 2015077629 A1 | 5/2015 |
| WO | 2017096058 A1 | 6/2017 |
| WO | 2017120214 A1 | 7/2017 |
| WO | 2018204870 A1 | 11/2018 |
| WO | 2018208284 A1 | 11/2018 |

OTHER PUBLICATIONS

International Preliminary Report on Patentability for International Application PCT/US2014/066926, issued May 24, 2016, dated Jun. 6, 2016, 12 Pgs.

International Preliminary Report on Patentability for International Application PCT/US2017/012161, issued Jul. 10, 2018, dated Jul. 19, 2018, 11 Pgs.

International Search Report and Written Opinion for International Application No. PCT/US2016/064449, completed Mar. 17, 2017, dated Apr. 4, 2017, 12 Pgs.

International Search Report and Written Opinion for International Application No. PCT/US2017/012161, completed Feb 24, 2017, dated May 5, 2017, 14 Pgs.

International Search Report and Written Opinion for International Application No. PCT/US2017/031619, Search Jul. 11, 2017, dated Aug. 14, 2017, 15 Pgs.

International Search Report and Written Opinion for International Application No. PCT/US2018/031230, completed Jul. 16, 2018, dated Aug. 1, 2018, 13 Pgs.

International Search Report and Written Opinion for International Application PCT/US2014/066926, Completed Feb. 2, 2015, dated Mar. 3, 2015, 14 pgs.

"Global Flat Panel Displays Market to Reach US$110 Billion by 2017", Global Industry Analysts, Inc., Mar. 15, 2012, 3 pgs.

"LCD TV Growth Improving, As Plasma and CRT TV Disappear", NPD DisplaySearch, Apr. 16, 2014, 2 pgs.

"Oxide TFT Production Forecast to Overtake LTPS in 2016", NPD DisplaySearch, Sep. 10, 2013, 4 pgs.

(56) References Cited

OTHER PUBLICATIONS

"Large AMOLED gets a cost edge over LCD", Sector Report/ Display, Korea Investment & Securities Co., Ltd. Aug. 16, 2011, 32 pgs.
"Spin coating", Wkipedia, Oct. 23, 2015; p. 1/2, para 1; Retrieved on Jul. 11, 2017.
Almudever et al., "Variability and reliability of CNFET technology: impact of manufacturing imperfections", Microelectronics Reliability, Feb. 1, 2015, vol. 55, No. 2, pp. 358-366.
Aradhya et al., "Electrothermal Bonding of Carbon Nanotubes to Glass", Journal of the Electrochemical Society, Jul. 22, 2008, vol. 155, No. 9, pp. K161-K165.
Arnold et al., "Sorting carbon nanotubes by electric structure using density differentiation", Nature Nanotechnology, Oct. 2006, vol. 3, pp. 60-65.
Ben-Sasson et al., "Patterned electrode vertical field effect transistor fabricated using block copolymer nanotemplates", Applied Physics Letters, Nov. 2009, vol. 95, pp. 213301-1-213301-3.
Briseno et al., "Patterning Organic Single-Crystal Transistor Arrays", Nature, Dec. 14, 2006, vol. 444, pp. 913-917.
Bronikowski et al., "Gas-phase production of carbon single-walled nanotubes from carbon monoxide via the HiPco process: a parametric study", J Vac. Sci. Technol. A., May 2, 2001, vol. 19, pp. 1800-1805.
Cao et al., "Medium-scale carbon nanotube thin-film integrated circuits on flexible plastic substrate", Nature, Jul. 24, 2008, vol. 454, pp. 495-500.
Capelli et al. "Organic light-emitting transistors with an efficiency that outperforms the equivalent light-emitting diodes", Nature Materials, Jun. 2010, vol. 9, pp. 496-503, published online May 2, 2010.
Chaban et al., "Buckybomb: Reactive Molecular Dynamics Simulation", Journal of Physics Chemistry Letters, Feb. 24, 2015, vol. 6, pp. 913-917, DOI: 10.1021/ acs.jpclett.5b00120.
Cherenack et al., "Amorphous—silicon thin film transistors fabricated at 300° C on a free-standing foil substrate of clear plastic", IEEE Electron. Dev. Lett. Nov. 2007, vol. 28, No. 11, pp. 1004-1006.
Chiang et al., "Purification and Characterization of Single-Wall Carbon Nanotubes (SWNTs) Obtained from the Gas-Phase Decomposition of CO (HiPco Process)", J. Phys. Chem. B, Aug. 10, 2001, vol. 105, pp. 8297-8301, doi:10.1021/jp0114891.
Dai et al., "Solution-processed, high-performance light-emitting diodes based on quantum dots", Nature, Nov. 6, 2014, vol. 515, 96-99.
De Volder et al., "Carbon nanotubes: present and future commercial applications", Science, Feb. 1, 2013, vol. 339, 535-539.
Drandova et al., "SiN capacitors and ESD", CS Mantech Conference, Apr. 24-27, 2006, pp. 83-86.
Dresselhaus et al., "Raman spectroscopy on isolated single wall carbon nanotubes", Carbon, 2002, vol. 40, pp. 2043-2061.
Gao et al., "Complementary Logic Gate Arrays Based on Carbon Nanotube Network Transistors", Small, 2013, vol. 9, No. 6, pp. 813-819.
Ghosh et al., "Advanced sorting of single-walled carbon nanotubes by nonlinear density-gradient ultracentrifugation", Nature Nanotechnology, 2010, vol. 5, pp. 443-450, published online May 9, 2010.
Ha et al., "Highly Uniform and Stable n-Type Carbon Nanotube Transistors by Using Positively Charged Silicon Nitride Thin Films", Nano Letters 2015, vol. 15, pp. 392-397, published Dec. 1, 2014.
Hone et al., "Thermal properties of carbon nanotubes and nanotube-based materials", Applied Physics A, Mar. 2002, vol. 74, pp. 339-343.
Iechi et al., "Vertical type organic light emitting device using thin-film ZnO electrode", Synthetic Metals, 2005, vol. 154, pp. 149-152.
Javey et al., "High-K dielectrics for advanced carbon-nanotube transistors and logic gates", Nature Materials, Dec. 2002, vol. 1, pp. 241-245, published online Nov. 17, 2002.
Javey et al., "Self-aligned ballistic molecular transistors and electrically parallel nanotube arrays", Nano Letters, May 24, 2004, vol. 4, No. 7, pp. 1319-1322.
Javey et al., "Ballistic carbon nanotube field-effect transistors", Nature, Aug. 7, 2003, vol. 424 , pp. 654-657.
Kim et al., "Polymer gate dielectric surface viscoelasticity modulates pentacene transistor performance", Science, Oct. 5, 2007, vol. 318, pp. 76-80.
Kim et al., "Electrical contacts to carbon nanotubes down to 1 nm in diameter", Applied Physics Letters, 2005, vol. 87, pp. 173101-1-173101-3.
Li et al., "Electronically Pure Single-Chirality Semiconducting Single-Walled Carbon Nanotube for Large-Scale Electronic Devices", ACS Applied Materials & Interfaces, Aug. 5, 2016, vol. 8, No. 32, pp. 20527-20533.
Li et al., "Silicon nitride gate dielectric for top-gated carbon nanotube field effect transistors", Journal of Vacuum Science & Technology B 22, Nov./Dec. 2004, pp. 3112-3114.
Liu et al., "Large-scale single-chirality separation of single-walled carbon nanotubes by simple gel chromatography", Nature Communications, May 10, 2011, vol. 2, No. 309, pp. 1-8.
Maehashi et al., "Electrical characterization of carbon nanotube field-effect transistors with SiN x passivation films deposited by catalytic chemical vapor deposition", Applied Physics Letters, 2008, vol. 92, pp. 183111-1-183111-3.
Nomura et al., "Room-temperature fabrication of transparent flexible thin-film transistors using amorphous oxide semiconductors", Nature, Nov. 25, 2004, vol. 432, pp. 488-492.
O'Connell et al., "Band gap fluorescence from individual single-walled carbon nanotubes", Science, Jul. 26, 2002, vol. 297, pp. 593-596.
Panzer et al., "Low-voltage operation of a pentacene field-effect transistor with a polymer electrolyte gate dielectric", Applied Physics Letters, Feb. 28, 2005, vol. 86, pp. 103503-1-103503-3.
Park et al., "Enhanced luminescence in top-gate-type organic light-emitting transistors", Applied Physics Letters, Aug. 16, 2004, vol. 85, No. 7, pp. 1280-1282.
Pei et al., "Polymer Light-Emitting Electrochemical Cells", Science, Aug. 25, 1995, vol. 269, No. 5227, pp. 1086-1088.
Perebeinos et al., "Schottky-to-Ohmic Crossover in Carbon Nanotube Transistor Contacts", Physical Review Letters, week ending Dec. 6, 2013, PRL 111, pp. 236802-1-236802-5, plus supplemental material.
Rutherglen et al., "Nanotube electronics for radiofrequency applications", Nature Nanotechnology, Dec. 2009, vol. 4, pp. 811-819, published online Nov. 29, 2009.
Shao et al., "Long-lifetime polymer light-emitting electrochemical cells", Advanced Materials, 2007, vol. 19, pp. 365-370.
Young, "When Can I Get My AMOLED TV", Information Display, 2010, vol. 10, pp. 24-29.
Zou et al., "Carbon Nanotube Driver Circuit for 6 x 6 Organic Light Emitting Diode Display", Scientific Reports, Jun. 29, 2015, vol. 5, No. 11755, pp. 1-9.
Armstrong et al., "Enhanced Propellant Combustion with Nanoparticles", Nano Letters, Jan. 9, 2003, vol. 3, No. 2, pp. 253-255, doi: 10.1021/nl025905k.
Bachilo et al., "Structure-assigned optical spectra of single-walled carbon nanotubes", Science, Dec. 20, 2002, vol. 298, pp. 2361-2366, doi: 10.1126/science.1078727.
Bhat et al., "Electroluminescence in ion-gel gated conjugated polymer field-effect transistors", Chemistry of Materials, Oct. 7, 2012, vol. 24, pp. 4060-4067, doi: 10.1021/cm301610w.
Bonhommeau et al., "Raman spectroscopic investigation of individual single-walled carbon nanotubes helically wrapped by ionic, semiconducting polymers", Journal of Physical Chemistry C, Jun. 20, 2013, vol. 117, pp. 14840-14849, doi: 10.1021/jp4037606.
Braga et al., "High-Transconductance Organic Thin-Film Electrochemical Transistors for Driving Low-Voltage Red-Green-Blue Active Matrix Organic Light-Emitting Devices", Advanced Functional Materials, Feb. 14, 2012, vol. 22, pp. 1623-1631, doi: 10.1002/adfm.201102075.
Brousseau et al., "Nanometric Aluminum in Explosives", Propellants, Explosives, Pyrotechnics, Feb. 27, 2002, vol. 27, pp. 300-306.

(56) References Cited

OTHER PUBLICATIONS

Cao et al., "Improved quantum efficiency for electroluminescence in semiconducting polymers", Nature, Feb. 4, 1999, vol. 397, pp. 414-417.
Chang et al., "Improved Electrical Performance of MILC Poly-Si TFTs Using CF4 Plasma by Etching Surface of Channel", IEEE Electron Device Letters, Feb. 2009, vol. 30, No. 2, pp. 130-132.
Cho et al., "Printable ion-gel gate dielectrics for low-voltage polymer thin-film transistors on plastic", Nature Materials, Nov. 2008, Published Online Oct. 19, 2008, vol. 7, pp. 900-906, doi: 10.1038/nmat2291.
Chortos et al., "Investigating Limiting Factors in Stretchable All-Carbon Transistors for Reliable Stretchable Electronics", ACS Nano, Jul. 26, 2017, vol. 11, pp. 7925-7937, doi: 10.1021/acsnano.7b02458.
Chortos et al., "Mechanically Durable and Highly Stretchable Transistors Employing Carbon Nanotube Semiconductor and Electrodes", Advanced Materials, 2016, Published Online Jul. 14, 2015, vol. 28, pp. 4441-4448, doi: 10.1002/adma.201501828.
Dlott, "Thinking big (and small) about energetic materials", Materials Science and Technology, Apr. 2006, vol. 22, No. 4, pp. 463-473, doi:10.1179/174328406X83987.
Dreizin, "Metal-based reactive nanomaterials", Progress in Energy and Combustion Science, Apr. 2009, vol. 35, pp. 141-167, doi:10.1016/j.pecs.2008.09.001.
Friend et al., "Electroluminescence in conjugated polymers", Nature, Jan. 14, 1999, vol. 397, pp. 121-128.
Gu et al., "Design of flat panel displays based on organic light emitting devices", IEEE Journal of Selected Optics in Quantum Electronics, Jan./Feb. 1998, vol. 4, pp. 83-99.
Gundlach et al., "Pentacene Organic Thin-Film Transistors—Molecular Ordering and Mobility", IEEE Electron Device Letters, Mar. 1997, vol. 18, No. 3, pp. 87-89.
Hennrich et al., "Length-Sorted, Large-Diameter, Polyfluorene-Wrapped Semiconducting Single-Walled Carbon Nanotubes for High-Density, Short-Channel Transistors", ACS Nano, Jan. 2015, vol. 10, No. 2, pp. 1888-1895, doi: 10.1021/acsnano.5b05572.
Ho et al., "Molecular-scale interface engineering for polymer light-emitting diodes", Nature, Mar. 30, 2000, vol. 404, No. 6777, pp. 481-484.
Hoven et al., "Electron injection into organic semiconductor devices from high work function cathodes", Proceedings of the National Academy of Sciences of the United States of America, Sep. 2, 2008, vol. 105, No. 35, pp. 12730-12735.
Hoven et al., "Ion motion in conjugated polyelectrolyte electron transporting layers", Journal of the American Chemical Society, Oct. 2007, vol. 129, No. 36, pp. 10976-10977, doi: 10.1021/ja072612q.
Hsu et al., "Control of Efficiency, Brightness, and Recombination Zone in Light0Emitting Field Effect Transistors", Advanced Materials, Jan. 25, 2012, vol. 24, pp. 1171-1175, doi: 10.1002/adma.201103513.
Isert et al., "The effect of encapsulated nanosized catalysts on the combustion of composite solid propellants", Combustion and Flame, 2015, Published Online Dec. 23, 2014, vol. 162, pp. 1821-1828.
Keplinger et al., "Stretchable, Transparent, Ionic Conductors", Science, Aug. 30, 2013, vol. 341, No. 6149, pp. 984-987, doi: 10.1126/science.1240228.
Kimura et al., "Low-temperature polysilicon thin-film transistor driving with integrated driver for high resolution light emitting polymer display", IEEE Transactions on Electron Devices, Dec. 1999, vol. 46, Issue 12, pp. 2282-2288.
Kudo, "Organic light emitting transistors", Current Applied Physics, 2005, First Published Jun. 7, 2004, vol. 5, pp. 337-340, doi: 10.1016/j.cap.2003.11.095, 2005, 337-340.
Li et al., "Molecular Design, Device Function and Surface Potential of Zwitterionic Electron Injection Layers", Journal of the American Chemical Society, Mar. 17, 2009, vol. 131, No. 25, pp. 8903-8912, doi: 10.1021/ja9018836.
Li et al., "Polyfluorinated electrolyte for fully printed carbon nanotube electronics", Advanced Functional Materials, Aug. 3, 2016, vol. 26, No. 38, pp. 6914-6920, doi: 10.1002/adfm.201601605.
Li et al., "The Effect of Interface States on Single-Walled Carbon Nanotube Transistors", ECS Journal of Solid State Science and Technology, Aug. 5, 2016, vol. 5, pp. M93-M98, doi: 10.1149/2.0271609jss.
Liang et al., "Elastomeric polymer light-emitting devices and displays", Nature Photonics, Oct. 2013, Published Online Sep. 22, 2013, vol. 7, pp. 817-824. doi: 10.1038/NPHOTON.2013.242.
Lin et al., "A novel LTPS-TFT pixel circuit compensating for TFT threshold-voltage shift and OLED degradation for AMOLED", IEEE Electron Device Letters, Feb. 2007, vol. 28, No. 2, pp. 129-131.
Lin et al., "Ambipolar-to-Unipolar Conversion of Carbon Nanotube Transistors by Gate Structure Engineering", Nano Letters, Mar. 12, 2004, vol. 4, No. 5, pp. 947-950.
Lin et al., "The Impact of Scaling-Down Oxide Thickness on Poly-Si Thin-Film Transistors' I-V Characteristics", IEEE electron device letters, Apr. 1994, vol. 15, No. 4, pp. 138-139.
Logdlund et al., "Theoretical-studies of the interaction between aluminum and poly(pphenylenevinylene) and derivatives", The Journal of Chemical Physics, Sep. 1, 1994, vol. 101, pp. 4357-4364, doi: 10.1063/1.467486.
Matyba et al., "The dynamic organic p-n junction", Nature Materials, Aug. 2009, Published Online Jun. 21, 2009, vol. 8, No. 8, pp. 672-676, doi: 10.1038/NMAT2478.
McCarthy et al., "Low-Voltage, Low-Power, Organic Light-Emitting Transistors for Active Matrix Displays", Science, Apr. 29, 2011, vol. 332, Issue 6029, pp. 570-573, doi: 10.1126/science.1203052.
Meda et al., "Nano-aluminum as energetic material for rocket propellants", Materials Science and Engineering C, Sep. 2007, vol. 27, Issues 5-8, pp. 1393-1396, doi: doi:10.1016/j.msec.2006.09.030.
Meda et al., "Nano-composites for rocket solid propellants", Composites Science and Technology, Apr. 2005, vol. 65, Issue 5, pp. 769-773.
Muccini, "A bright future for organic field-effect transistors", Nature Materials, Aug. 2006, vol. 5, No. 8, pp. 605-613.
Nakamura et al., "Improvement of Metal-Insulator-Semiconductor-Type Organic Light-Emitting Transistors", Japanese Journal of Applied Physics, Mar. 21, 2008, vol. 47, No. 3, pp. 1889-1893, doi: 10.1143/JJAP.47.1889.
Noh et al., "Ultra-thin polymer gate dielectrics for top-gate polymer field-effect transistors", Organic Electronics, 2009, Published Online Nov. 12, 2008, vol. 10, No. 1, pp. 174-180, doi: 10.1016/j.orgel.2008.10.021.
Oh et al., "Vertical Type Organic Transistor Using C60 and its Application for OLET", Molecular Crystals and Liquid Crystals, Dec. 21, 2006, vol. 458, No. 1, pp. 247-254, doi: 10.1080/15421400600932439.
Park et al., "Flexible full color organic light emitting diode display on polyimide plastic substrate driven by amorphous indium gallium zinc oxide thin-film transistors", Applied Physics Letters, Jul. 6, 2009, vol. 95, No. 1, pp. 013503-1-013503-3, doi: 10.1063/1.3159832.
Park et al., "High-resolution electrohydrodynamic jet printing", Nature Materials, Oct. 2007, vol. 6, pp. 782-789, doi: 10.1038/nmat1974, published online Aug. 5, 2007.
Pivkina et al., "Nanomaterials for Heterogeneous Combustion", Propellants, Explosives, Pyrotechnics, Feb. 26, 2004, vol. 29, No. 1, pp. 39-48; DOI: 10.1002/prep.200400025.
Powell, "The Physics of Amorphous-Silicon Thin-Film Transistors", IEEE Transactions on Electron Devices, Dec. 1989, vol. 36, No. 12, pp. 2753-2763.
Rossi, "Two Decades of Research on Nano-Energetic Materials", Propellants Explos. Pyrotech., Jun. 11, 2014, vol. 39, pp. 323-327. DOI: 10.1002/prep.201480151.

(56) References Cited

OTHER PUBLICATIONS

Rouhi et al., "Fundamental limits on the mobility of nanotube—based semiconducting inks", Advanced Materials, 2011, Published Online Oct. 26, 2010, vol. 23, pp. 94-99, doi: 10.1002/adma.201003281.

Rouhi et al., "High performance semiconducting nanotube inks: progress and prospects", ACS Nano, Oct. 4, 2011, vol. 5, No. 11, 8471-8487, doi: 10.1021/nn201828y.

Sabourin et al., "Functionalized Graphene Sheet Colloids for Enhanced Fuel/ Propellant Combustion", ACS Nano, Nov. 19, 2009, vol. 3, No. 12, pp. 3945-3954, doi: 10.1021/nn901006w.

Schoppler et al., "Molar extinction coefficient of single-wall carbon nanotubes", Journal of Physical Chemistry C, Jun. 22, 2011, vol. 115, pp. 14682-14686, doi: 10.1021/jp205289h.

Seo et al., "Improved High-Efficiency Organic Solar Cells via Incorporation of a Conjugated Polyelectrolyte Interlayer", Journal of the American Chemical Society, May 10, 2011, vol. 133, pp. 8416-8419, doi: /10.1021/ja2037673.

Seo et al., "Improved Injection in n-Type Organic Transistors with Conjugated Polyelectrolytes", Journal of the American Chemical Society, Oct. 4, 2009, vol. 131, pp. 18220-18221.

Seo et al., "Solution-Processed Organic Light-Emitting Transistors Incorporating Conjugated Polyelectrolytes", Advanced Functional Materials, Jul. 18, 2011, vol. 21, pp. 3667-3672, doi: 10.1002/adfm.201100682.

Shulaker et al., "Carbon nanotube computer", Nature, Sep. 26, 2013, vol. 501, pp. 526-530, doi: 10.1038/nature12502.

Sirringhaus et al., "Integrated Optoelectronic Devices Based on Conjugated Polymers", Science, Jun. 12, 1998, vol. 280, No. 5370, pp. 1741-1744, doi: 10.1126/science.280.5370.1741.

Slinker et al., "Direct measurement of the electric-field distribution in a light-emitting electrochemical cell", Nature Materials, Nov. 2007, Published Online Sep. 30, 2007, vol. 6, No. 11, pp. 894-899, doi: 10.1038/nmat2021.

Swensen et al., "Light emission from an ambipolar semiconducting polymer field-effect transistor", Applied Physics Letters, Dec. 15, 2005, vol. 87, pp. 253511-1-253511-3.

Sze et al., "Physics of Semiconductor Devices", Third Edition, Wiley, Toronto, 1985, 763 pgs. (presented in five parts).

Takahashi et al., "Carbon nanotube active-matrix backplanes for conformal electronics and sensors", Nano Letters, Nov. 3, 2011, vol. 11, pp. 5408-5413, doi: 10.1021/nl203117h.

Tang et al., "Organic electroluminescent diodes", Applied Physics Letters, Sep. 21, 1987, vol. 51, No. 12, pp. 913-915, doi: 10.1063/1.98799.

Tans et al., "Room-temperature transistor based on a single carbon nanotube", Nature, May 7, 1998, vol. 393, pp. 49-52.

Wang et al., "Wafer-scale fabrication of separated carbon nanotube thin-film transistors for display applications", Nano Letters, Sep. 30, 2009, vol. 9, No. 12, pp. 4285-4291, doi: 10.1021/nl902522f.

Wu et al., "Top-down patterning and self-assembly for regular arrays of semiconducting single-walled carbon nanotubes", Advanced Materials, Jul. 22, 2014, vol. 26, pp. 6151-6156, doi: 10.1002/adma.201401108.

Xia et al., "Printed Sub-2 V Gel-Electrolyte-Gated Polymer Transistors and Circuits", Advanced Functional Materials, Jan. 11, 2010, vol. 20, pp. 587-594, doi: 10.1002/adfm.200901845.

Xu et al., "Vertical organic light emitting transistor", Applied Physics Letters, Aug. 30, 2007, vol. 91, 092991-1-092991-3, doi: 10.1063/1.2778751.

Yamauchi et al., "Fabrication of Vertical Organic Light-Emitting Transistor Using ZnO Thin Film", Japanese Journal of Applied Physics, Apr. 24, 2007, vol. 46, No. 4B, pp. 2678-2682, doi: 10.1143/JJAP.46.2678.

Yan et al., "A high-mobility electron-transporting polymer for printed transistors", Nature, Jan. 21, 2009, vol. 457, doi: 10.1038/nature07727, 10 pgs.

Yang et al., "Control of Cationic Conjugated Polymer Performance in Light Emitting Diodes by Choice of Counterion", Journal of the American Chemical Society, May 27, 2006, vol. 128, pp. 14422-14423, doi: 10.1021/ja063723c.

Zaumseil et al., "Spatial control of the recombination zone in an ambipolar light-emitting organic transistor", Nature materials, Jan. 2006, vol. 5, pp. 69-74.

Zhang et al., "Self-Enhanced Catalytic Activities of Functionalized Graphene Sheets in the Combustion of Nitromethane: Molecular Dynamic Simulations by Molecular Reactive Force Field", ACS Applied Materials & Interfaces, Jul. 23, 2014, vol. 6, pp. 12235-12244. doi: 10.1021/am501562m.

* cited by examiner

DEVICES, STRUCTURES, MATERIALS AND METHODS FOR VERTICAL LIGHT EMITTING TRANSISTORS AND LIGHT EMITTING DISPLAYS

RELATED APPLICATIONS

This application is a continuation of U.S. application Ser. No. 14/550,656 filed Nov. 21, 2014, which application claims priority to U.S. Provisional Application No. 61/907,324 filed Nov. 21, 2013, the disclosures of which are incorporated herein by reference in their entireties.

FIELD OF THE INVENTION

Devices, structures, materials and methods for vertical light emitting transistors and light emitting displays are presented.

BACKGROUND OF THE INVENTION

Active Matrix Organic Light Emitting Diode (AMOLED) displays have been highly anticipated by electronic consumers due to their well-recognized advantages in power consumption, pixel brightness, viewing angle, response time, and contrast ratio over liquid crystal displays (LCD). (See, e.g., G. Gu and S. R. Forrest, *IEEE Journal of Selected Topics in Quantum Electronics*, vol. 4, pp. 83-99, 1998, the disclosure of which is incorporated herein by reference.) However, the advances promised by AMOLEDs have not been realized at least partially as the result of limitations in conventional active matrix thin-film transistor (TFT) backplanes. The current active matrix TFT backplanes used to drive AM-LCD pixels are typically made of amorphous silicon (a-Si), which has a low mobility ($-1$ $cm^2V^{-1}s^{-1}$) and poor stability, and is therefore unsuitable for AMOLED pixels. (See, M. J. Powell, *IEEE Transactions on Electron Devices*, vol. 36, pp. 2753-2763, 1989, the disclosure of which is incorporated herein by reference.) As a result of these deficiencies, currently AMOLED displays are driven by low temperature polycrystalline silicon (poly-Si) TFTs that suffer from high fabrication cost and time, and device size, orientation, and inhomogeneity limitations, all of which present a severe challenge to increasing display size and production yield. (See, e.g., C.-P. Chang and Y.-C. S. Wu, *IEEE electron device letters*, vol. 30, pp. 130-132, 2009; Y.-J. Park, M.-H. Jung, S.-H. Park and O. Kim, *Japanese Journal of Applied Physics*, vol. 49, pp. 03CD01, 2010; and P.-S. Lin, and T.-S. Li, *IEEE electron device letters*, vol. 15, pp. 138-139, 1994, each of the disclosures of which are incorporated herein by reference.)

Solution processable organic semiconductor materials are attractive alternatives to poly-Si because of their homogeneity, low cost, and varied deposition methods. (See, e.g., D. J. Gundlach, et al., *IEEE Electron Device Letters*, vol. 18, pp. 87-89, 1997; H. Yan, et al., *Nature*, vol. 457, pp. 679-686, 2009; and A. L. Briseno, et al., Nature, vol. 444, pp. 913-917, 2006, the disclosures of each of which are incorporated herein by reference.) However, in a conventional TFT architecture, the low-mobility of organic films requires a large source-drain voltage (>20 V) to turn on the OLED devices. (See, H. Sirringhaus, et al., *Science*, vol. 280, pp. 1741-1744, 1998, the disclosure of which is incorporated herein by reference.) Stable high-transconductance organic thin-film electrochemical transistors using a high capacitance electrolyte as the gate dielectric layer have been demonstrated. (See, e.g., J. H. Cho et al., *Nature Materials*, vol. 7, pp. 900-906, 2008; and Y. Xia, et al., *Advanced Functional Materials*, vol. 20, pp. 587-594, 2010, the disclosures of each of which are incorporated herein by reference.) Using these devices it is possible to control a high efficiency red, green and blue AMOLED with supply voltages near 4 V and sub-1 V driving voltages. (See, e.g., D. Braga, et al., Advanced Functional Materials, vol. 22, pp. 1623-1631, 2012, the disclosure of which is incorporated herein by reference.) In addition, carbon nanotube enabled vertical organic thin-film field effect transistors that give on-currents sufficient to drive OLED pixels at low operating voltages because of their intrinsic short channel lengths have also been demonstrated. (See, e.g., M. A. McCarthy, et al., *Science*, vol. 332, pp. 570-573, 2011, the disclosure of which is incorporated herein by reference.) Though these approaches are promising, the required fabrication steps still limit the simplicity of system architecture and consequently production costs.

SUMMARY OF THE INVENTION

Devices, structures, materials and methods for vertical light emitting transistors (LETs) and light emitting displays (LEDs) are provided.

Some embodiments are direct to vertical light emitting transistors, including:
- a light emitting cell including a light emitting layer formed of at least one light emitting material, the light emitting layer having first and second sides in conductive relation to a conductive drain electrode and a conductive source electrode;
- at least one capacitor including a dielectric layer formed of at least one dielectric material, the at least one dielectric layer having first and second sides in conductive relation to one of either the conductive source or drain electrodes, and a conductive gate electrode; and
- at least one substrate in supportive relation with each of said drain/source and gate electrodes;
- wherein the drain and source electrodes are the cathode and anode of the light emitting cell; and
- wherein at least the electrode disposed between the light emitting layer and the dielectric layer is a conductive porous electrode has sufficient open portions to exhibit a surface coverage of no greater than 50%, such that the dielectric layer makes direct contact with the light emitting layer through the open portions of the conductive porous electrode.

In other embodiments the vertical light emitting transistor includes:
- at least two capacitors and two gate electrodes, a first capacitor having a dielectric layer disposed between the drain electrode and a first gate electrode and a second capacitor disposed between the source electrode and a second gate electrode; and
- wherein the drain and source electrodes are conductive porous electrodes that have sufficient open portions to exhibit a surface coverage of no greater than 50%, such that both of the dielectric layers make direct contact with the light emitting layer through the open portions of the conductive porous electrodes.

In still other embodiments, the light emitting layer is formed of a light emitting material selected from the group consisting of a crystalline semiconductor selected from GaN, GaP, GaAs, AlGaAs, GaAsP, AlGaInP, ZnSe, InGaN and AlN; a semiconductor nanowire selected from Si and GaAs; a quantum wall; an organometallic complex; an Ir organometallic complex; a small organic conjugated molecule; porphyrin; pentacene; and a conjugated polymer selected from PPV, PVK, MEH-PPV, PPF, PFO and PPP.

In yet other embodiments, at least one of the drain, source, or gate electrodes comprise an electrode material selected from graphene sheets, doped Si, ZTO, ITO, Au, Al, Cu, Ni, Mo, Cr, Ag, metal nanowires, metal plate, metal meshes, metal grids, holey copper, holey graphene, conductive polymers, and a low coverage network of a plurality of nanowires.

In still yet other embodiments, the at least one conductive porous electrode is formed from a plurality of nanowires formed into one of the group of a random or patterned network of a plurality of metal or graphene nanowires, a nanowire metal mesh, a nanowire grid, and a nanowire network encased within an elastomeric material. In some such embodiments the plurality of nanowires are formed from a plurality of metal nanowires selected from Ag, Au and Cu having an aspect ratio of at least 1000. In other such embodiments the plurality of metal nanowires have a diameter less than about 200 nm and a length greater than about 1 micron, and having a surface coverage less than 10%, a sheet resistance less than 100 Ω/sq and a transmission greater than 75%.

In still yet other embodiments, the dielectric material is selected from the group of an oxides selected from $SiO_2$, $Al_2O_3$, $HfO_2$, $ZrO_2$; a nitride; $Si_3N_4$; an inorganic salts selected from LiF, CsF, $BaTiO_3$, and $SrTiO_3$; a dielectric polymer selected from PMMA, Teflon, CYTOP, and Nafion; and an ionic gel formed from the combination of a dielectric polymer and an ionic liquid.

In still yet other embodiments, the vertical light emitting transistors may include at least one additional light emitting enhancement layer selected from the group consisting of electron injection dipole layers, transportation dipole layers, conjugate polyelectrolyte layers, and hole injection layers.

In still yet other embodiments the substrate is selected from the group consisting of flexible plastics, Si wafer, glass, sapphire, and ITO.

Other embodiments are directed to methods of forming vertical light emitting transistors, including:
  forming a light emitting layer formed of at least one light emitting material, the light emitting layer having first and second sides;
  forming at least one of a conductive drain electrode and a conductive source electrode in conductive relation with at least one side of said light emitting layer;
  forming a least one capacitor including a dielectric layer formed of at least one dielectric material, the at least one dielectric layer having first and second sides in conductive relation to one of either the conductive source or drain electrodes, and a conductive gate electrode; and
  encapsulating the formed layers using one of either a glass or barrier film;
  wherein at least the electrode disposed between the light emitting layer and the dielectric layer is a conductive porous electrode that has sufficient open portions to exhibit a surface coverage of no greater than 50%, such that the dielectric layer makes direct contact with the light emitting layer through the open portions of the conductive porous electrode.

In other embodiments the method includes one of the following combination of steps:
  disposing the light emitting material atop a PEDOT coated ITO substrate, disposing one of either the drain or source electrode atop the light emitting layer, disposing the dielectric layer atop the one of either the drain or source electrode present atop the light emitting layer, and disposing the gate electrode atop the dielectric layer;
  disposing a first dielectric layer atop a first gate electrode, disposing one of either the drain or source electrode atop the first dielectric layer, disposing the light emitting layer atop the one of either the drain or source electrode disposed atop the first dielectric layer, disposing one of either the drain or source electrode atop the light emitting layer; disposing a second dielectric layer over the one of either the drain or source electrode disposed atop the light emitting layer, and disposing a second gate electrode atop the second dielectric layer;
  disposing the dielectric layer atop the gate electrode, disposing one of either the drain or source electrode atop the dielectric layer, and disposing the light emitting layer atop a PEDOT coated ITO substrate that is further laminated with the one of either the drain or source electrode which is disposed atop the dielectric layer; and
  disposing the dielectric layer atop the gate electrode, disposing one of either the drain or source electrode disposed atop the dielectric layer, disposing the light emitting layer atop the one of either the drain or source electrode disposed atop the dielectric layer, and disposing the light emitting layer that is laminated with the one of either the drain or source electrode not disposed atop the dielectric layer.

In still other embodiments, the light emitting layer is formed by a deposition process selected from plasma enhanced chemical vapor deposition, low pressure chemical vapor deposition, molecular beam epitaxy, spin-coating, spray coating, aerosol jet printing, inkjet printing, screen printing, gravure printing, and flexograph printing. In some such embodiments the method further includes thermal annealing the light emitting material in an inert atmosphere at a temperature range of from 60 to 140° C. for a duration of about 10 to 60 minutes. In still other such embodiments the light emitting layer is a conjugated polymer formed by spin-coating the conjugated polymer in an organic solution having a concentration of 1 to 10 mg/mL with a speed range from 800 to 5000 rpm followed by thermal annealing the conjugated polymer in an inert atmosphere at a temperature range of from 60 to 140° C. for a duration of about 10 to 60 minutes. In yet other such embodiments the light emitting layer is a conjugated polymer formed by aerosol jet printing the conjugated polymer in an organic solution using a sheath gas flow of about 20 to 50 cubic centimeters per minute, a carrier gas flow of about 10 to 20 cubic centimeters per minute, a nozzle diameter of from about 60 to 300 μm, and an atomization selected from ultrasonic atomization at a voltage that ranges from about 20 to 48 V, and pneumatic atomization with an atomizer flow of about 600 cubic centimeters per minute, to generate an aerosol having a diameter of about 1 to 5 μm.

In yet other embodiments at least one of the source, drain, and gate electrodes comprise a metal selected from Al, Au, Ag, Cu, Ni, Cr, Mo, and their combination formed by plasma enhanced chemical vapor deposition or low pressure chemical vapor deposition.

In still yet other embodiments the at least one conductive porous electrode is formed from a plurality of nanowires formed into one of the group of a random or patterned network of a plurality of metal or graphene nanowires, a nanowire metal mesh, a nanowire grid, a nanowire network encased within an elastomeric material, holey copper and holey graphene. In some such embodiments the conductive porous electrode comprises a silver nanowire network with a surface coverage less than 10%, a sheet resistance less than 15 Ω/sq, and a transmission greater than 75%, and is formed by a process selected from spin-coating, spray coating, aerosol jet printing, inkjet printing, screen printing, gravure printing, and flexography printing the silver nanowire network followed by thermal annealing the silver nanowire network in an inert environment at a temperature range of from about 60 to 160° C. for a duration of about 10 to 60 minutes, and washing the silver nanowire network with isopropanol. In other such embodiments the conductive porous electrode is formed by spin-coating a Ag nanowire isopropanol solution with a concentration range of from about 0.1 mg/mL to 10 mg/mL with a spinning speed range of from about 800 to 5000 rpm, and repeating said spin-coating from about 1 to 20 times. In still other such embodiments the conductive porous electrode is formed by aerosol jet printing a Ag nanowire isopropanol solution with a concentration range of from about 0.1 mg/mL to 10 mg/mL using a sheath gas flow of about 20 to 50 cubic centimeters per minute, a carrier gas flow of about 10 to 20 cubic centimeters per minute, a nozzle diameter of about 60 to 300 µm, fiducial management with an overlay registration of about 1 to 2 µm, and a pneumatic atomization with about a 600 cubic centimeters per minute atomizer flow to generate an aerosol having diameter of from about 1 to 5 µm. In yet other such embodiments the porous electrode is one of a metal mesh, metal grid, holey copper and holey graphene formed by a method selected from evaporating metal using a metal frame mask, and patterning the metal using photolithography.

In still yet other embodiments the dielectric layer comprises a dielectric material selected from $SiO_2$, $Al_2O_3$, $Si_3N_4$, $HfO_2$, $ZrO_2$ and LiF having a thickness of from about 50 to 500 nm formed by a process selected from one of either plasma enhanced chemical vapor deposition and low pressure chemical vapor deposition.

In still yet other embodiments the dielectrics layer comprises one of a dielectric polymer, an ionic gel, and a dielectric polymer/nanoparticle composite having a thickness of from about 100 to 5000 nm formed by a process selected from spin-coating, spray coating, aerosol jet printing, inkjet printing, screen printing, gravure printing, and flexograph printing the dielectric material followed by thermally annealing the dielectric layer in an inert atmosphere at temperature range from about 60 to 160° C. for a duration of from about 10 to 60 minutes.

In still yet other embodiments the dielectric layer is formed by spin-coating one of a dielectric polymer, an ionic gel, and a dielectric polymer/nanoparticle composite disposed in an organic solution with a concentration range of from about 0.1 mg/mL to 10 mg/mL at a spinning speed range of from about 800 to 5000 rpm, and repeating for about 1 to 20 times.

In still yet other embodiments the dielectric layer is formed by aerosol jet printing one of a dielectric polymer, an ionic gel, and a dielectric polymer/nanoparticle composite in an organic solution having a concentration range of from about 0.1 mg/mL to 10 mg/mL using a pneumatic atomization with about 600 cubic centimeters per minute atomizer flow or ultrasonic atomization with power range from 20-48V to generate an aerosol in diameter of from about 1 to 5 µm, a sheath gas flow of from about 20 to 50 cubic centimeters per minute, a carrier gas flow of from about 10 to 20 cubic centimeters per minute, a nozzle diameter of from about 60 to 300 µm, and a fiducial management with an overlay registration of from about 1 to 2 µm.

In still yet other embodiments the method includes forming at least two capacitors and two gate electrodes, including a first capacitor having a dielectric layer disposed between the drain electrode and a first gate electrode and a second capacitor disposed between the source electrode and a second gate electrode, wherein at least the drain and source electrodes are conductive porous electrodes having a surface coverage of no greater than 50%, such that both of the dielectric layers make direct contact with the light emitting layer through the open portions of the porous electrodes.

Still other embodiments are directed to vertical light emitting displays including a plurality of pixels comprising a plurality of vertical light emitting transistors electronically coupled into a thin film transistor backplane, each vertical light emitting transistor including:
  a light emitting cell including a light emitting layer formed of at least one light emitting material, the light emitting layer having first and second sides in conductive relation to a conductive drain electrode and a conductive source electrode;
  a least one capacitor including a dielectric layer formed of at least one dielectric material, the at least one dielectric layer having first and second sides in conductive relation to one of either the conductive source or drain electrodes, and a conductive gate electrode; and
  at least one substrate in supportive relation with each of said drain and gate electrodes;
  wherein the drain and source electrodes are the cathode and anode of the light emitting cell;
  wherein at least the electrode disposed between the light emitting layer and the dielectric layer is a conductive porous electrode having sufficient open portions to exhibit a surface coverage of no greater than 50%, such that the dielectric layer makes direct contact with the light emitting layer through the open portions of the conductive porous electrode;
  wherein the light emitting layers emit one of either a single color or a plurality of colors; and
  wherein each pixel is formed of at least a first transistor configured for switching and at least a second transistor configured for scribing.

In other embodiments each of the vertical light emitting transistors includes at least two capacitors and two gate electrodes, a first capacitor having a dielectric layer disposed between the drain electrode and a first gate electrode and a second capacitor disposed between the source electrode and a second gate electrode, such that each pixel is formed of a single transistor configured for both switching and scribing, wherein the drain and source electrodes are conductive porous electrodes that have sufficient open portions to exhibit a surface coverage of no greater than 50%, such that both of the dielectric layers make direct contact with the light emitting layer through the open portions of the conductive porous electrodes.

In still other embodiments, the light emitting layer is formed of a light emitting material selected from the group consisting of a crystalline semiconductor selected from GaN, GaP, GaAs, AlGaAs, GaAsP, AlGaInP, ZnSe, InGaN and AlN; a semiconductor nanowire selected from Si and GaAs; a quantum wall; an organometallic complex; an Ir organometallic complex; a small organic conjugated molecule; porphyrin; pentacene; and a conjugated polymer selected from PPV, PVK, MEH-PPV, PPF, PFO and PPP.

In yet other embodiments, the dielectric material is selected from the group of an oxides selected from $SiO_2$, Al$_2$O$_3$, HfO$_2$, ZrO$_2$; a nitride; Si$_3$N$_4$; an inorganic salts selected from LiF, CsF, BaTiO$_3$, and SrTiO$_3$; a dielectric polymer selected from PMMA, Teflon, CYTOP, and Nafion; and an ionic gel formed from the combination of a dielectric polymer and an ionic liquid.

In still yet other embodiments, the substrate is selected from the group consisting of flexible plastics, Si wafer, glass, sapphire, and ITO.

In still yet other embodiments, at least one of the drain, source, or gate electrodes comprise an electrode material selected from graphene sheets, doped Si, ZTO, ITO, Au, Al, Cu, Ni, Mo, Cr, Ag, metal nanowires, metal plate, metal meshes, metal grids, holey copper, holey graphene, conductive polymers, and a low coverage network of a plurality of nanowires.

In still yet other embodiments, the at least one conductive porous electrode is formed from a plurality of nanowires formed into one of the group of a random or patterned network of a plurality of metal or graphene nanowires, a nanowire metal mesh, a nanowire grid, and a nanowire network encased within an elastomeric material. In some such embodiments the plurality of nanowires are formed from a plurality of metal nanowires selected from Ag, Au and Cu having a diameter less than about 200 nm and a length greater than about 1 micron, and having a surface coverage less than 10%, a sheet resistance less than 100 Ω/sq and a transmission greater than 75%.

Additional embodiments and features are set forth in part in the description that follows, and in part will become apparent to those skilled in the art upon examination of the specification or may be learned by the practice of the invention. A further understanding of the nature and advantages of the present invention may be realized by reference to the remaining portions of the specification and the drawings, which forms a part of this disclosure.

BRIEF DESCRIPTION OF THE DRAWINGS

The description will be more fully understood with reference to the following figures and data graphs, which are presented as exemplary embodiments of the invention and should not be construed as a complete recitation of the scope of the invention, wherein.

DETAILED DESCRIPTION OF THE INVENTION

Turning to the drawings, devices, materials and methods for light emitting transistors (LETs) and light emitting displays (LEDs) are provided. In particular embodiments, architectures for vertical light emitting transistors (VLETs), and in particular vertical polymer light emitting transistors (VPLETs) for active matrix organic light emitting displays (AMOLEDs) and AMOLEDs incorporating such VPLETs are described. Although many VLET architectures are provided, in embodiments a novel doubly-gated VLET architecture is described. In other embodiments, porous transparent conductive electrodes, such as for example nanowire (NW) electrodes (including silver (Ag) NW networks) alone or in combination with conjugated light emitting polymers (LEPs) and dielectric materials are utilized in forming organic light emitting transistors (OLETs). In some embodiments, combinations of thin films of ionic gels, LEDs, NW electrodes and relevant substrates and gates are utilized to construct LETs, including singly and doubly gated VLETs. In many embodiments the VPLET substrates are transparent and/or flexible, and can be made of suitable materials such as PET. In other embodiments, processes such as, for example, spin-coating and printing processes are utilized to deposit layers of one or more of NW electrodes, LEDs, and dielectric materials on various substrates to construct LETs, including singly and doubly gated VLETs.

Figure 1:
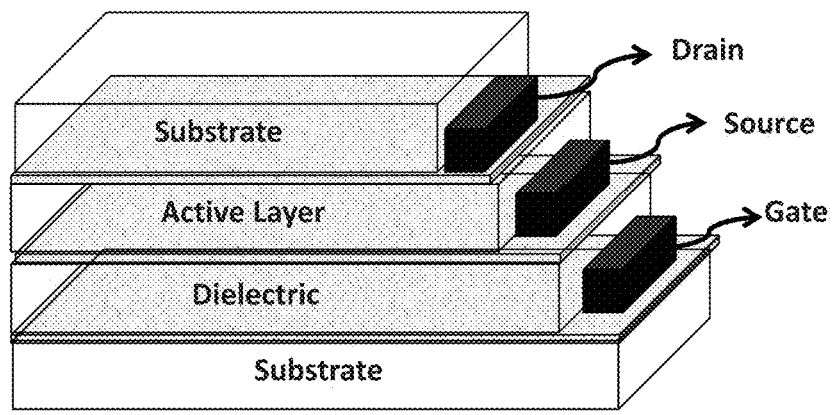
FIG. 1 provides a schematic diagram of a vertical polymer light emitting transistor in accordance with embodiments of the invention.

Active matrix organic light emitting displays (AMO-LEDs) are highly attractive due to their power saving, ultra high definition, and broad viewing angles. In particular, advances in organic light emitting transistors (OLETs) exhibit improved external efficiency over organic light emitting diodes (OLEDs) by directly modulating charge carriers of light emitting materials. Further, inducing a vertical structure in OLETs (as shown in FIG. 1) circumvents the intrinsic low mobility of organic materials by providing short channel length, thereby making it possible to achieve high conductance at low power and low voltages, thus enhancing the energy conversion efficiency, the lifetime and stability of the organic materials. Moreover, combining thin film transistor (TFT) switching and OLED light emitting properties in a single device leads to a simplified fabrication process and reduced cost. However, technical challenges in forming the underlying TFT backplanes in these devices limit display size variation and cost reduction. As will be described below, the use of novel material and manufacturing combinations, such as highly transparent porous conductive electrodes (e.g., NW network electrodes), and flexible materials enable the formation of VLETs that overcome the limitations in display backplanes fabricated with amorphous/crystalline/poly silicon, metal oxides and organic materials, and will be suitable for various needs.

Transparent Porous Conductive Materials

As previously discussed, OLETs have been demonstrated to exhibit ON/OFF functionality of TFTs and the electroluminescence of OLEDs in a single device. (See, e.g., J. Zaumsei, R. H. Friend and H. Sirringhaus, *Nature materials*, vol. 5, pp. 69-74, 2005; R. Capelli, et al., *Nature Materials*, vol 9, pp. 496-503, 2010; and M. Muccini, *Nature Materials*, vol. 5, pp. 605-613, 2006, the disclosures of which are incorporated herein by reference.) Vertical-type OLETs have been reported on varied designs and operating principles to operate in low-voltages with short channel length. In particular, LEPs have been fabricated into PLETs with noble metals as electrodes. (See, e.g., J. Zaumsei, R. H. Friend and H. Sirringhaus, Nature materials, vol. 5, pp. 69-74, 2005, the disclosure of which is incorporated herein by reference.) Various VPLETs were also reported that demonstrated poor performance. (See, e.g., B. Park and H. Takezoe, Applied Physics Letters, vol. 85, pp. 1280-1282, 2004; H. Lechi, et al., Synthetic Metals, vol. 154, pp. 149-152, 2005; K. Kudo, Current Applied Physics, vol. 5, pp. 337-340, 2005; S. Y. Oh, et al., Molecular Crystals and Liquid Crystals, vol. 458, pp. 247-254, 2006; Z. Xu, et al., Applied Physics Letters, vol. 91, pp. 092911, 2007; and H. Yamauchi, et al., Japanese Journal of Applied Physics, vol. 46, pp. 2678, 2007, the disclosures of each of which are incorporated herein by reference.) In addition, severe material limitations exist as to usable electrode materials. In particular, electrodes of transmittance greater than 98% across the visible spectrum window are required to allow for the emission of light in these devices across their full aperture. (See, e.g., B. Park and H. Takezoe, *Applied Physics Letters*, vol. 85, pp. 1280-1282, 2004; H. Lechi, et al., *Synthetic Metals*, vol. 154, pp. 149-152, 2005; K. Kudo, *Current Applied Physics*, vol. 5, pp. 337-340, 2005; S. Y. Oh, et al., *Molecular Crystals and Liquid Crystals*, vol. 458, pp. 247-254, 2006; Z. Xu, et al., *Applied Physics Letters*, vol. 91, pp. 092911, 2007; H. Yamauchi, et al., *Japanese Journal of Applied Physics*, vol. 46, pp. 2678, 2007; and K. Nakamura, et al., *Japanese Journal of Applied Physics*, vol. 47, pp. 1889, 2008, the disclosures of each of which are incorporated herein by reference.)

Transparent conductive electrodes are characterized by benchmark values for transparency and conductivity. A good material for use in VPLET devices should have a high transparency and a low sheet resistance. Currently the state of the art in transparent conductive electrodes is ITO (Indium titanium oxide), which has an excellent combination of high transparency and low sheet resistance. However, ITO is made of low abundance elements, and thus increases device cost. There are many fast-emerging transparent conductive materials like TCO (Transparent conductive oxide), PEDOTs (poly(3,4-ethylenedioxythiophene)) and other highly doped conductive polymers, carbon nanotubes and graphene. (See, e.g., C. Keplinger, et al., *Science*, vol. 341, pp. 984-987, 2013, the disclosure of which is incorporated herein by reference.) As shown in Table 1, below, under the equivalent transmittance, the sheet resistances of most of these new materials are about 3 to 6 times higher than that of ITO.

TABLE 1

Comparison of Current Transparent Conductive Materials

| Material Type | Typical Transparency | Typical Conductivity |
|---|---|---|
| ITO | 85-95% | 30-100 Ω/sq |
| TCOs | 80-93% | 100-200 Ω/sq |
| Conductive Polymers | >85-90% | 200-1000 Ω/sq |
| Metal Grids | <75% | 3-100 Ω/sq |
| Nano Silver Films | >92% | 100-300 Ω/sq |
| Carbon Nanotube Films | 70-90% | 100-1000 Ω/sq |
| Graphene | >90% | 100 Ω/sq |
| Nanowire (Ag) | 88-92% | 10-300 Ω/sq |

Accordingly, in many embodiments a transparent conductive electrode material is provided. In some embodiments such electrodes are formed from conductive random or patterned networks of nanowires (NW networks), including NW networks formed into supporting materials, such as supporting grids, meshes, plates, or other materials, such as holey copper or holey graphite (graphene). In other embodiments, the NW networks may be formed by embedding a plurality of nanowires into an elastomeric material, such that an electrically conductive stretchable electrode may be formed. In some embodiments, a Ag nanowire network is embedded in an elastomeric material to form a stretchable transparent electrode with a transmittance of 80-85% and a sheet resistance of less than 100 Ω/sq, and in some embodiments from 10 to 25 Ω/sq.

In other embodiments, OLETs and VPLETs that incorporate such transparent conductive electrode materials, such as NW networks, for use, for example, as supportive electrodes for the LETs and LEDs are provided. Embodiments of such electrode materials have now been discovered to exhibit equivalent or better figures of merit when compared to state-of-the art materials, such as ITO. In particular, as summarized in Table 1 above, in many embodiments NW networks, for example, including grids, meshes, etc., may be formed that demonstrate broad sheet resistances from 10 Ω/sq to 300 Ω/sq, in some embodiments less than 100 Ω/sq, and in some embodiments less than 15 Ω/sq; and high transmittance >75%, and in some embodiments >90%.

Beyond transmittance and resistance another benchmark parameter that is often disregarded is the porosity or surface coverage of the electrode material. Low surface coverage values permit light emitting materials to directly contact the dielectric layer allowing for direct gate modulation, which in turn allows for optimized charge-carrier balance, which is important for brightness, lifetime and external quantum efficiency of OLEDs. (See, e.g., C. V. Hoven, et al., *Proceedings of the National Academy of Sciences of the United States of America*, vol. 105, pp. 12730-12735, 2008, the disclosure of which is incorporated herein by reference.) Accordingly, in many embodiments suitable highly transparent conductive electrode materials are formed into conductive porous electrodes such that they have relatively low surface coverage <50%, in some cases <25%, in some cases <10%, and in some cases as low as <1%. In embodiments, such conductive porous electrodes may be formed from a random or patterned network of a plurality of metal or graphene nanowires, a nanowire metal mesh, a nanowire grid, a nanowire network encased within an elastomeric material, and/or such nanowires supported on holey copper or holey graphene.

OLETs thus formed with such porous conductive electrodes (e.g., formed of such NW network materials) offer ideal structures to control the injection, transport and recombination of electron and hole, especially in both cathode and anode sides. These properties indicate that embodiments of conductive porous electrodes formed from highly transparent and porous materials, such as, for example, NW networks in accordance with this disclosure, are superior materials for vertical OLETs when compared to other currently developed transparent conductive materials. (Some exemplary benchmark properties are disclosed in Tables 1 and 2.)

Figure 2:
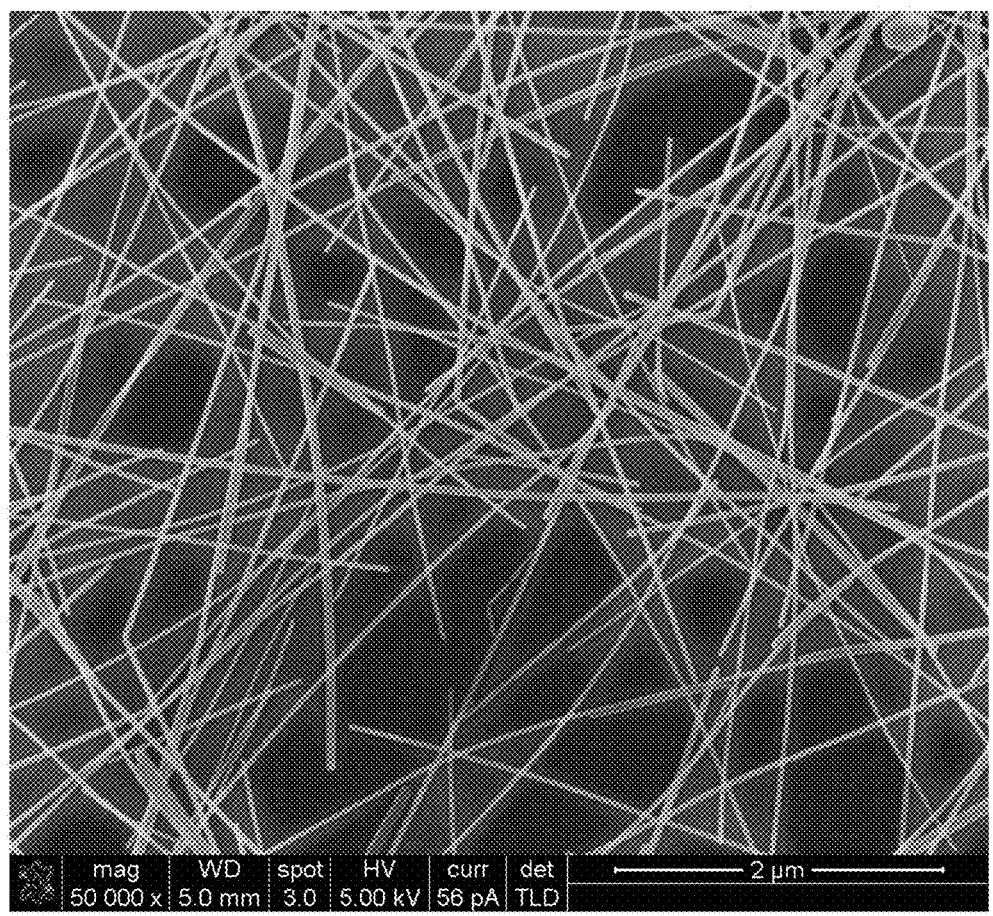
FIG. 2 provides an SEM image of an exemplary random silver nanowire network in accordance with embodiments of the invention.

Although the above benchmarked properties have been established for conductive porous electrode materials formed from Ag NW nanowires, it should be understood that any suitable conductive material capable of being formed into conductive porous electrode materials having suitable transmittance, resistivity and surface coverage properties may be used in embodiments, including, for example, Ag, Au, Cu and graphene. In many embodiments, the porous conductive electrodes are formed from NW networks formed from high aspect ratio nanowires having an aspect ratio of, for example, >1000. In some embodiments the NW networks are formed from a plurality of metallic nanowires, such as for example, Ag having a diameter of less than around 200 nm, in some embodiments less than around 35 nm, and a length of greater than around 1 μm, in some embodiments greater than 35 μm. Further, it should be understood that the conductive porous electrode materials may be formed of randomly deposited NW (such as that shown in the SEM of an exemplary Ag NW conductive network presented in FIG. 2) or engineered NW that are arranged in grids or meshes or atop supportive materials such as holey copper or holey graphene, and may also be produced in any shape and dimension suitable for use within a particular VPLET device. In some embodiments, the conductive porous electrodes formed of NW networks are produced as thin sheets or strips that are sized to provide a supportive conductive surface to a particular PLED layer within a VPLET device.

Finally, as will be described in greater detail below, many embodiments are directed to OLETs and VPLETs that incorporate such conductive porous electrode materials, such as NW networks, including Ag NW networks for use, for example, as supportive electrodes for LET and LED devices.

LED and LET Devices

Figure 3:
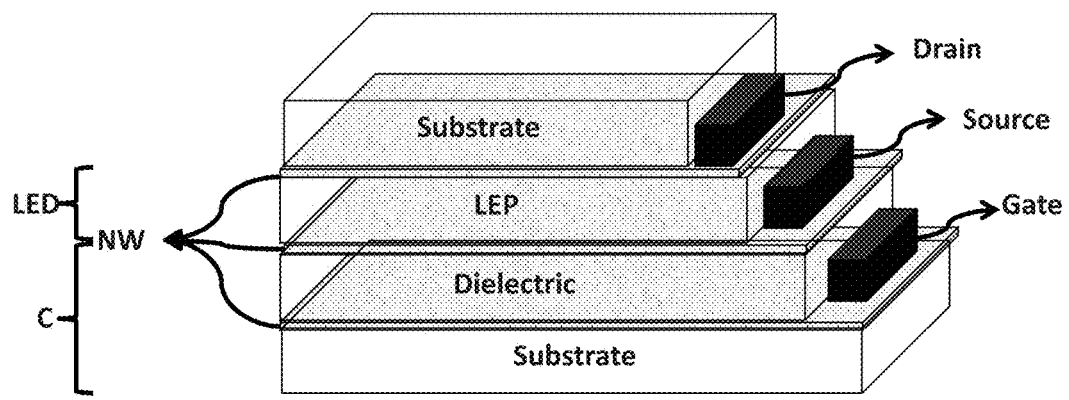
FIG. 3 provides a schematic diagram of a vertical polymer light emitting transistor incorporating nanowire network electrodes in accordance with embodiments of the invention.

Although embodiments of porous conductive electrodes are described above, it should be understood that many embodiments are directed to LET and LED devices formed using such porous conductive electrode materials as conductive elements within those devices. FIG. 3 provides a schematic of an exemplary VPLET in accordance with embodiments of the invention. As shown, the device generally a capacitor (C) and light emitting cells (LED) joined by a common electrode. Three electrodes are required in a VPLET, a common-source electrode, a gate electrode, and a drain electrode, and associated contacts. A light emitting material, such as a light emitting polymer (LEP) forms an active layer between the source and drain electrodes, which in many embodiments also function as the cathode/anode of the LED. A high resistance dielectric layer is provided between the source and gate electrodes to complete the device.

Preferably the porous conductive electrodes (e.g., NW network electrodes) are formed with a surface coverage of no more than 50%, in some embodiments less than 25%, in some embodiments less than 10%, and in some further embodiments less than 1%, such that the dielectric can make direct contact with the LEP to allow for direct gate modulation. In many embodiments, using such a vertical structure and the transparent conductive low surface coverage electrodes, VPLET devices may be fabricate that exhibit a maximum external efficiency >5%, brightness >10,000 Cd/m$^2$ and full aperture at low power and low voltage, with improved lifetime and stability. A full list of exemplary performance metrics for devices constructed in accordance with embodiments of the invention are provided in Table 2, below.

TABLE 2

Performance Metrics for Ag NW Enabled VPLETs

| Figures of Merits | Units | Values |
|---|---|---|
| Ag NW Concentration | % | >99 |
| Ag NW Length | μm | >1 |
| Ink Viscosity | mPa · s | <15 |
| Ag NW Lifetime | Days (free aggregation) | >180 |
| Ag NW thickness | μm | <10 |
| Ag NW Printing Density | Tubes/μm$^2$ | >30 |
| Transmittance (Ag NW) | % | >90 |
| Resistivity (Ag NW) | Ω/sq | ~30 |
| Ink Solution Type | Au | UT Dots |
| Line Width Minimum | μm | 10 |
| Alignment Error | ±μm | 5 |
| Resistivity Au | Ω/sq | ~1 |
| Dielectric Thickness | μm | 10 |
| Gate Leakage Current | pA/cm$^2$ | >10 |
| Polymer Emitter | PFO/Super-yellow/ MEH-PPV | Supplier Merck |
| Mobility | cm$^2$/Vs | $10^{-3}$-$10^{-4}$ |
| On/Off Ratio | Ratio | >$10^8$ |
| Switch Rate | Hz | >100 |
| Supply Voltage | V | <4 |
| Operating Voltage | V | <1 |
| Brightness | Cd/m$^2$ | 10000 |
| Efficiency | % | >5 |

Accordingly, in many embodiments vertical light emitting transistors are provided that include a light emitting cell that includes a light emitting layer formed of at least one light emitting material, a least one capacitor that includes a dielectric layer formed of at least one dielectric material, and at least one substrate in supportive relation with these elements. These elements (light emitting cells and capacitors) are placed into appropriate conductive relation to drain, source and gate. In many embodiments, at least the electrode disposed between the light emitting layer and the dielectric layer is a conductive porous electrode, for example, formed of a transparent network of a plurality of nanowires, wherein the nanowires have an aspect ratio of at least 1000, such that the porous electrode has sufficient open portions to exhibit a surface coverage of no greater than 50%, such that the dielectric layer makes direct contact with the light emitting layer through the open portions of the porous electrode.

Although the above discussion focuses primarily on single gate electrodes, as will be described VLET architectures incorporating multiple capacitors and gate electrodes are provided to form doubly gated VLETs. Accordingly, in some embodiments the vertical light emitting transistor includes at least two capacitors and two gate electrodes, disposed between the drain electrode and a first gate electrode and between the source electrode and a second gate electrode.

It should be understood that the materials and methods used to form the required components of these VPLET devices may take any form suitable for a desired application. For example, the substrate layers may be formed of either traditional rigid materials such as silicon wafer, glass, ITO, or flexible materials such as PET, Kapton, polyimides so long as the substrates allow for the deposition/growth of the necessary functional layers of the devices (dielectric, LEP, transparent conductive electrodes, etc.).

Likewise, any suitable PLED may be used in association with embodiments of the VPLET devices described herein. Some examples of suitable LEPs include, poly(1,4-phenylene vinylene) (PPV), Poly(2-methoxy-5-(2-ethylhexyloxy)-1,4-phenylenevinylene) (MEH-PPV), poly(1,4-phenylene) (PPP), polyfluorenes (PFO), nitrogen containing polymers, such as, for example, poly(2,5-pyridine vinylene) or poly(9-vinylcarbazole) (PVK), poly(thiophenes), and water-soluble LEPs such as sulfonated PPV, PPP and PF; and light emitting small molecules including organometallic Iridium complexes, small conjugated organic molecules such as porphyrin and pentacene for example. It should also be understood that embodiments of VLETs do not have to use LEPs, and can be formed with other types of light emitting materials, including semiconductor nanowires such as may be formed of Si or GaAs, quantum walls such as GaN, and conventional semiconductor materials across the entire wavelength spectrum, such as, for example, infrared emitters (GaAs), red emitters (AlGaAs & GaP), orange emitters (GaAsP & GaP), yellow emitters (AlGaInP & GaP), green emitters (GaN & GaP), blue emitters (ZnSe), violet emitters (InGaN), ultraviolet emitters (AlN), etc. And, these materials may be formed and/or embedded within elastomeric materials such that they are flexible allowing for the formation of flexible VLETs and thus displays.

A variety of dielectric materials may also be used in embodiments, such as for example, ionic gels formed of dielectric polymers and ionic liquids, such as, for example, polystyrene-co-poly(methyl methacrylate)-co-polystyrene (PS-PMMA-PS)/1-ethyl-3-methylimidazolium (trifluoromethylsulfonyl)imide (EMIM TFSI), BaTiO3/PMMA∥PEDOT/PSS, n-octadecylphosphonic acid SAM∥PEDOT/PSS, and CYTOP, and other printable or thermal vapor deposited dielectric materials such as dielectric polymers including PMMA, Teflon, CYTOP, Nafion and the like; oxides including, $SiO_2$, $Al_2O_3$, $ZrO_2$, $HfO_2$, $TiO_2$, and the like; inorganic salts including, LiF, CsF, $SrTiO_3$, $BaTiO_3$ and the like; and nitrides including $Si_3N_4$, etc.

A variety of additional layers might also be included in embodiments of the devices. For example, electron injection and transportation layers incorporating dipole molecules for PLEDs may also be included. Such thin layers of such dipole molecules function by correcting the orientation of the dipole leading to an increase in the effective work function and the improvement of electron injection in PLED devices. In particular, it has been found that a spin-coated thin layer with 0.1% weight 1-(3-hexadecylimidazolyl)-tris(1-imidazolyl)borate ($C_{16}$-$Blm_4$) in methanol solution improved the performance of PLEDs. (See, e.g., H. P. Li, et al., Journal of the American Chemical Society, vol. 131, pp. 8903-8912, 2009; and H. P. Li, et al., U.S. patent application Ser. No. 12/592,761, 2009, the disclosures of which are incorporated herein by reference.)

Likewise, in some embodiments conjugated polyelectrolytes (CPE) may be used to improve the efficiency of PLEDs, polymer solar cells, and thin-film transistors. These improvements have been ascribed to the enhanced electron injection ability of CPE. (See, e.g., R. Yang, et al., Journal of the American Chemical Society, vol. 128, pp. 14422-14423, 2006; J. H. Seo, et al., Journal of the American Chemical Society, vol, 133, pp. 8416-8419, 2011; and J. H. Seo, et al., Journal of the American Chemical Society, vol. 131, pp. 18220-18221, 2009, the disclosures of each of which are incorporated herein by reference.) Recently, it was demonstrated that by introducing a CPE layer between gold electrodes (Drain/Source) and light emitting polymers, the performance of PLETs were remarkably improved, again as a result of enhanced electron injection again. (See, e.g., J. H. Seo, et al., Advanced Functional Materials, vol. 21, pp. 3667-3672, 2011, the disclosure of which is incorporated herein by reference.) Alternatively or in addition, organic species, such as propionylethyleneimine-co-ethyleneimine (PEI-EI) may be introduced to improve the electron injection of the LEPs.

Finally, for hole injection layers, polyanilines, PEDOTs and polythiophene derivatives, as well as small molecules like cyano carbons such as, for example tetrafluoro-tetracyanoquinodimethane (F4-TCNQ), TCNQ, trichloroethylene (TCE), and others may be used. With gate modulation, the induced increase of charge carriers (including electron or hole) can improve both charge injection and charge transportation.

In addition, although the above has assumed that the conductive electrodes would be formed of conductive porous electrode materials, such as, for example, NW network materials, it should be understood that the devices may also have other electrode types. For example, in some embodiments, one or more conductive porous source and drain electrodes may be incorporated with gate electrodes formed from materials such as, for example, graphene sheets, ITO, Au, Al, Cu, Ni, Mo, Cr, Ag, metal nanowires, metal meshes, metal grids, holey copper and holey graphene, and conductive polymers such as, poly(3,4-ethylenedioxythiophene)/poly(styrenesulfonate) (PEDOT/PSS). Likewise, although the electrode layers may be made of NW networks or other suitable materials, the contacts associated with those electrode layers may be made of any suitable materials, such as, for example, Mo, Ni, Cr, Al, Cu, and Au.

Figure 4:
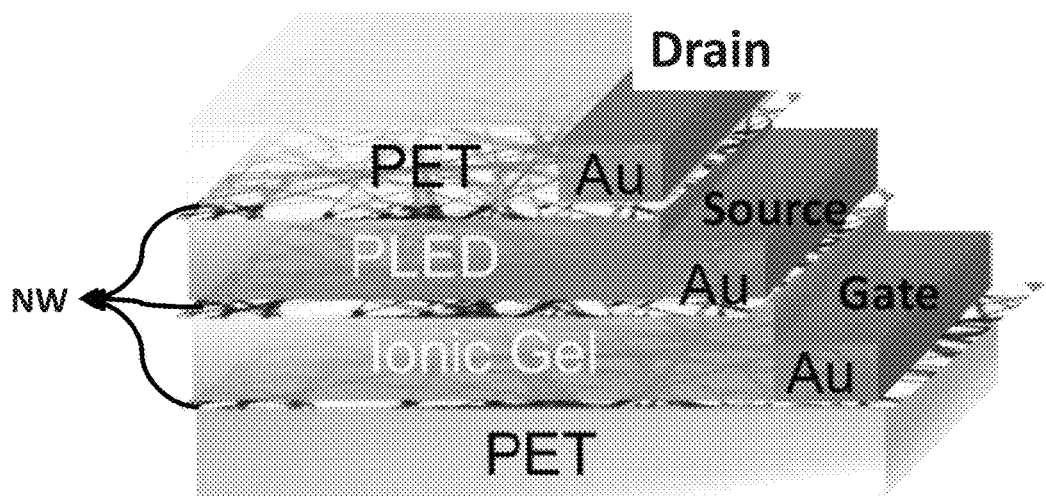
FIG. 4 provides a schematic diagram of a singly gated vertical polymer light emitting transistor in accordance with embodiments of the invention.

Finally, although a generalized device structure has been described, it should be understood that the materials and layers discussed above may be combined in a variety of different configurations, including in singly gated VLETs (FIG. 4). For example, as shown in FIG. 4 a singly gated VLET in accordance with embodiments would generally include at least drain, source and gate conductive porous electrode, such as a NW network conductive electrodes surrounding a light emitting layer (such as formed by a PLED), and a dielectric layer (such as an ionic gel) sandwiched between the light emitting layer and a further gate electrode (which could again be formed of a conductive porous electrode, such as, a NW network electrode). In these embodiments the singly-gated VLET may be supported by any suitable material, such as, for example, a flexible polymer such as PET. A few exemplary singly gated VLET device material architectures contemplated in accordance with embodiments would include:

- a conductive porous electrode (e.g., NW network) on a Au (Al) supported dielectrics layer (LiF, ionic gel) with ITO supported polymer emitters to form NW enabled VPLETs gated by a dielectrics layer (such as, e.g., LiF, ionic gel).
- a conductive porous electrode (e.g., Ag NW network) on a silicon wafer with ITO supported polymer emitters to form Ag NW enabled VPLETs gated by $SiO_2$.

a conductive porous electrode (e.g., Ag NW network) on a silicon wafer with a conductive porous electrode supported polymer emitter to form NW enabled VPLETs gated by $SiO_2$.

a conductive porous electrode (e.g., Ag NW network) on flexible substrates (PET) to form a NW electrode, a dielectrics layer (ionic gel, LiF) atop a NW conductive porous electrode, a NW conductive porous electrode again atop of the dielectrics layer, and a NW|dielectrics layer|NW electrode with a NW conductive porous electrode supported polymer emitter to form singly gated NW enabled VPLETs on NW electrodes.

Figure 5:
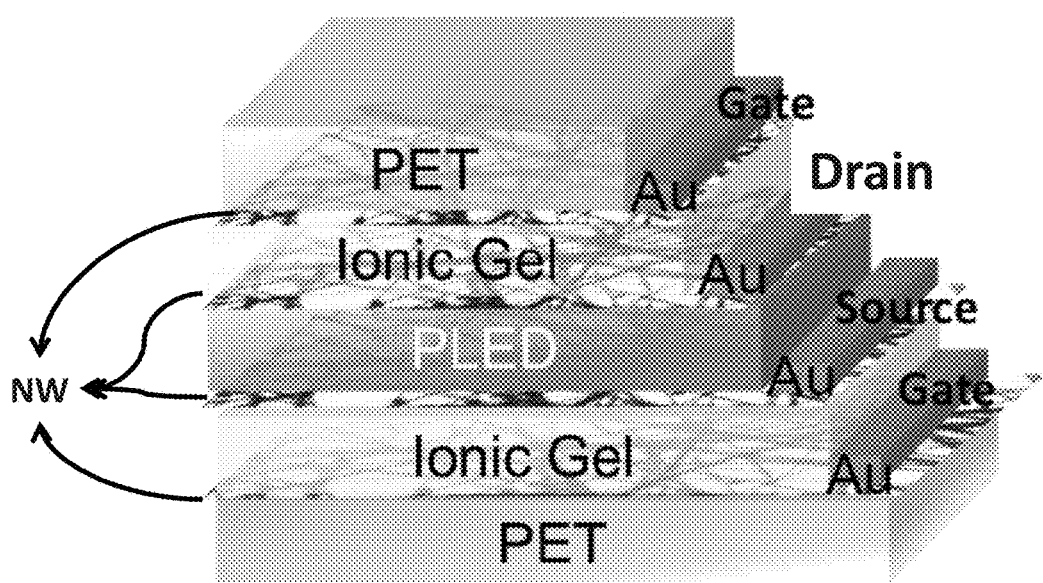
FIG. 5 provides a schematic diagram of a doubly gated vertical polymer light emitting transistor in accordance with embodiments of the invention.

In addition, although the above has described conventional singly gated architectures VLETs using novel combinations of materials in accordance with some embodiments, other embodiments are directed to novel architectures allowing for doubly gated VLETs. Embodiments of such doubly gated VLETs are shown schematically in FIG. 5. As shown, the doubly gated VLETS in accordance with embodiments include two gate electrodes and two layers of dielectric material (such as ionic gels) sandwiching the drain and source electrodes and in turn the light emitting layer (such as a PLED). An exemplary construction of such a doubly gated VLET might include, for example, a NW conductive porous electrode on flexible substrates (such as, e.g., PET) to form NW gate electrodes, then a dielectric layer (such as an ionic gel, LiF) atop of a NW conductive porous drain electrode, NW conductive porous electrodes again atop of a dielectric layer, and a NW|dielectric layer|NW electrode with a NW electrode|dielectrics layer|NW supported polymer emitter to form doubly-gated NW enabled VPLETs on NW conductive porous electrodes.

Figure 6A:
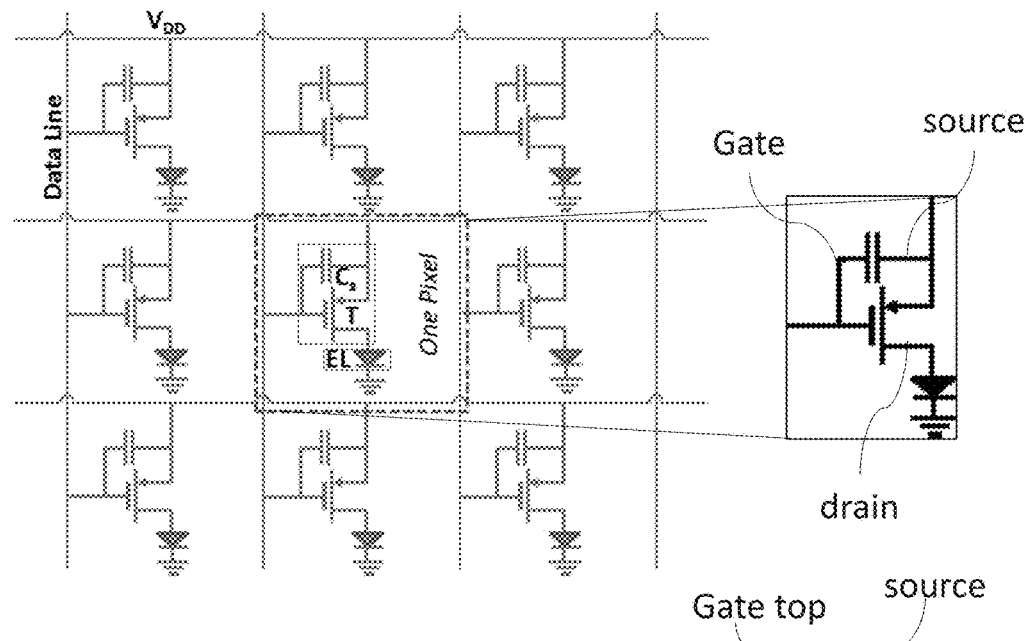
FIGS. 6a and 6b provide circuit diagrams of many pixel containing light emitting displays comprising a plurality of singly (6a) and doubly (6b) gated vertical light emitting transistors in accordance with embodiments of the invention.
Figure 6B:
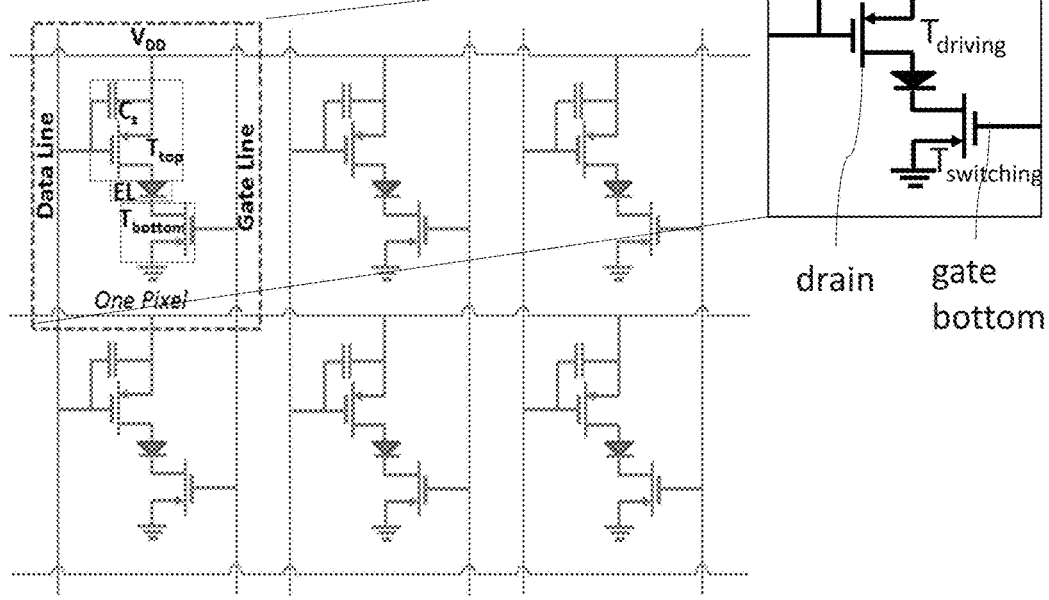

Circuit diagrams comparing the construction of the singly and doubly gated VLETS are provided in FIGS. 6a and 6b. As shown in FIG. 6a, in a singly gated VLET there is a single gated transistor interconnected with the gate electrode along the data line. The source electrode is in turn connected to the $V_{DD}$, and the drain electrode is connected to the LE layer. The TFT turns on when a voltage pulse is applied to the gate electrode. As a result, the signal voltage can be transmitted to the drain, and subsequently, the light emitting layer (EL), which is connected as load to the TFT.

While this is a well-known architecture, in some embodiments, a second gate electrode and "gate line" is introduced into the circuits. As shown in FIG. 6b, in this embodiment, the light emitting layer is interconnected to the drain electrode through this second gate electrode (labeled as gate bottom in FIG. 6b). This doubly gated VLET architecture allows for the adjustment of the charge carrier from the top and bottom electrodes, and for the control of the transportation, injection and recombination of charge carriers to reach charge carrier balance for maximum efficiency and brightness. Moreover, whereas in a singly gated VLET an additional transistor is required to perform switching and scribing, in a doubly gated VLET a single device can serve both functions simultaneously.

More detailed descriptions of these exemplary structures, their construction and performance is provided in the Exemplary Embodiments provided below. However, although examples of specific structures and combinations of materials and layers have been discussed, it should be understood that the various components described herein may be combined and arranged in a variety of device architectures contemplated within the disclosed embodiments.

Methods for Manufacturing LET and LED Devices

Some embodiments are directed to methods of depositing NW conductive materials for conductive porous electrodes to enable VPLETs and AMOLEDs generally. Although any suitable method of deposition may be used with the current invention including, for example, additive manufacturing, molecular beam epitaxy (MBE) chemical vapor deposition (CVD), atomic layer deposition (ALD), and plasma enhanced using low cost printing, spin-coating, spray coating methods, in many embodiments, printing, such as aerosol jet printing, may be used to deposit one or more of the layers of the LET and LED devices, including LEP inks as active light emitting materials and NW inks as transparent conductive porous electrodes of VPLETs on substrates. In particular, it has been found that printing methods, such as aerosol, roll to roll, screen and ink jet, for example, may be used to form NW networks, nanoparticles, polymer emitters, ionic gels, and conjugated polyelectrolytes that can be used to improve PLET performance, and to produce NW porous conductive electrode supported polymer light emitting devices.

Printing is one of the most promising techniques for inexpensive large area fabrication of plastic and nanomaterials electronics. In particular, aerosol-jet printing enables finer feature sizes than traditional ink-jetting and screen printing technologies. Aerosol jet printing utilizes an innovative direct-writing and aerodynamic focusing technology that produces electronics and physical structures with feature sizes down to 10 microns line width and 20 nm thickness. These systems can also print a wide variety of materials including conductive nanoparticle inks, screen printing pastes, polymers insulators, adhesives, etchants, and even biological matter onto various substrates like non-planar surfaces. As a result, the range of possible components that can be printed include transistors, integrated circuits, photovoltaics, LED's, displays and sensors. Also, direct aerosol-jet printing simplifies the printing process as the material is deposited as a pre-defined pattern. Another aspect of current printing is its low-cost, precise deposition, low environmental impact and large area fabrication due to the small number of process steps, small amount of materials and high through-put. (See, e.g., J.-U. Park, et al., Nature Materials, Vol. 6, pp. 782-789, 2007, the disclosure of which is incorporated herein by reference.)

In embodiments of the current invention printing system capable of printing over complex conformal surfaces, in deep trenches, and in high dense vertical interconnects for high performance of multi-chip packages may be used. One exemplary process utilizes a jet aerosol system such as the 3-D Optomec Aerosol Jet™ printer.

Figure 7:
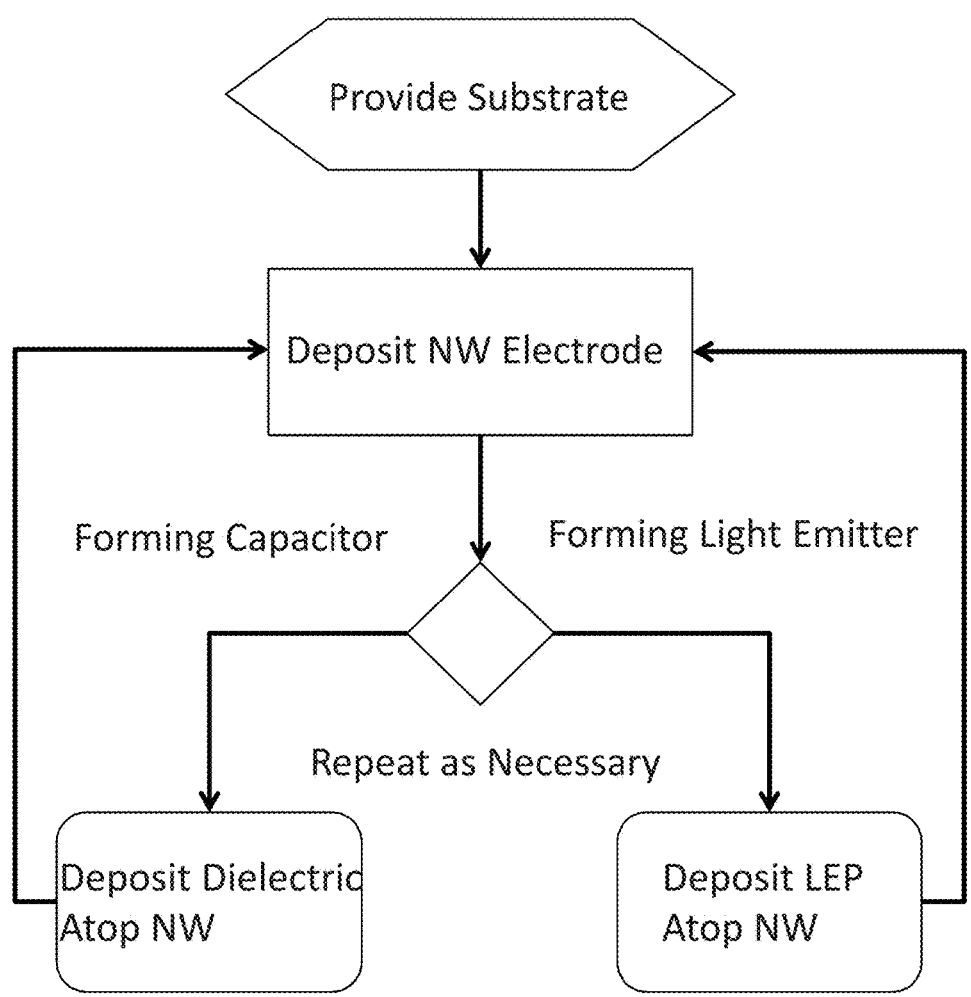
FIG. 7 provides a flow chart of a process for depositing vertical polymer light emitting transistors in accordance with embodiments of the invention.

One advantage of the described depositions methods is that the different electrical and electronic components can be printed on top of each other, saving space and increasing reliability and sometimes they are all transparent. Accordingly, in some embodiments, deposition techniques for non-planar surfaces, such as spin-coating or printing may be used to deposit the conductive porous NW network electrodes as well as coat LEPs or ionic gels atop of the NW network conductive porous electrodes to form integrated NW enabled VPLETs, which can be defined as display products and components manufactured using deposition methods and electrically functional materials, such as prinking with electrically conductive inks. A flow chart of such a process is provided in FIG. 7. As shown, using a deposition technique in accordance with embodiments, it is possible, provided a suitable substrate is present, to deposit the supportive porous electrodes (NW) and then directly deposit atop these electrodes the necessary LEP layers (for light emitting structures) or dielectric materials (for capacitor structures), and to repeat this deposition process as necessary to form singly or doubly gated devices as described above.

In certain specific embodiments, aerosol jet printing can be utilized, where the aerosol jet printing is carried out using the following parameters; ultrasonic atomization at a voltage that ranges from about 20 to about 48 V, or pneumatic atomization with about 600 cubic centimeters per minute atomizer flow to generate aerosol in a diameter of about 1 to 5 µm, a sheath gas flow of about 20 to 50 cubic centimeters per minute, a carrier gas flow of about 10 to 20 cubic centimeters per minute, a nozzle diameter of from about 50 to 350 µm, such as, for example, 60 µm, 100 µm, 150 µm, 200 µm, 250 µm, or 300 µm, and a fiducial management with overlay registration of from about 1 to 2 µm. In certain embodiments, the carrier gas may be inert, including ultra-pure nitrogen, argon or combinations thereof. Utilizing such a printing technique it is possible to manufacture single and doubly gated VLETs that exhibit a maximum external efficiency >5%, brightness >10,000 Cd/m$^2$ and full aperture at low power and low voltage, with improved lifetime and stability.

EXEMPLARY EMBODIMENTS

Additional embodiments and features are set forth in part in the exemplary embodiment that follow, and in part will become apparent to those skilled in the art upon examination of the specification or may be learned by the practice of the invention. None of the specific embodiments are proposed to limit the scope of the remaining portions of the specification and the drawings, and they are provided as exemplary of the devices, methods and materials disclosed herein. In particular, although specific structures and particular combinations of materials are recited, it should be understood that these are merely provided as examples, and any suitable alternative architectures and materials may be substituted.

Example 1

Figure 8:
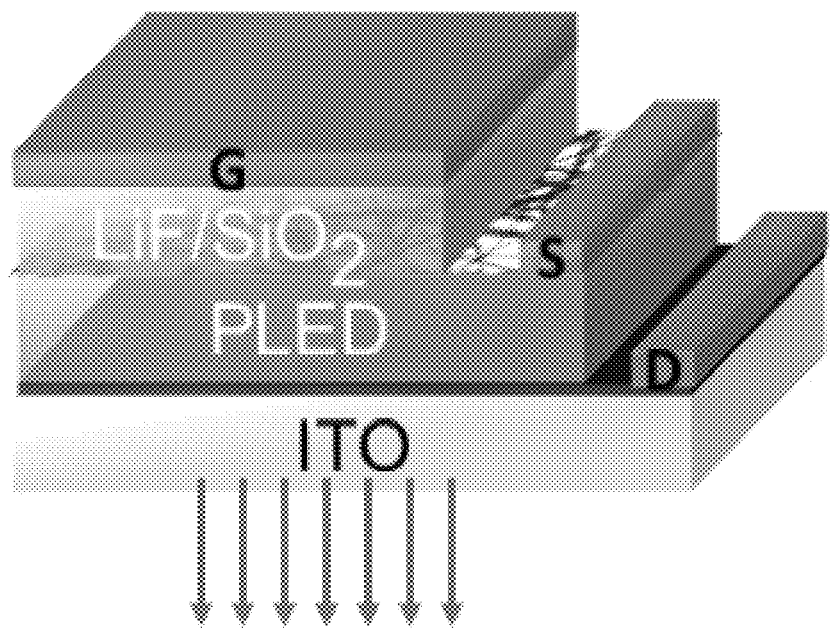
FIG. 8 provides a schematic diagram of a Ag NW enabled vertical polymer light emitting transistor in accordance with embodiments of the invention.

Spin Coating Ag NW Enabled VPLETs with Evaporated Dielectrics and Metal Gate Electrode on ITO In one exemplary embodiment, shown schematically in FIG. 8, ITO was used as an anode and the transmission layer from which light from the light emitting cell may be emitted. A PEDOT/PSS (PH1000) was spin coated on the ITO at 2,000 rpm to serve as a drain electrode (D). After annealing at 140° C. for 10 minutes, super yellow THF solution was spin-coated at 5,000 rpm to form the PLED layer. On the top of super yellow layer (PLED), a 2 mg/mL Ag NW isopropanol solution was spin-coated at 2,000 rpm and reapplied for at least >5 times to form a conductive source electrode (S). Then a 200 nm thick silicon oxide was evaporated using low pressure chemical vapor deposition to form a dielectric layer. On top of the silicon oxide dielectric layer, 150 nm Al was sputter deposited using an electrode mask to form a gate electrode (G). The formed Ag NW enabled VPLETs were then characterized with a Keithley 4200 Semiconductor Characterization System (SCS).

Example 2

Printing Ag NW Enabled VPLETs with ITO on Silicon Wafer

In one exemplary embodiment, printed Ag NW enabled VPLETs comprised of ITO as transparent porous conductive electrodes and light emitting polymers as channel materials on silicon wafer are provided. This process includes printing a uniform Ag NW network on silicon wafer, LEPs, and laminating PEDOT/PSS coated ITO with printed LEPs to achieve printed Ag NW enabled VPLETs with gate modulated brightness and external efficiency higher than PLEDs. Using aerosol jet printing technologies it is possible to print Ag NW networks on any substrate layer-by-layer allowing for the printing of a Ag NW enabled VPLET on silicon wafers of various SiO$_2$ thickness.

LEPs (blue: PFO, green: super-yellow, red: MEH-PPV) have been fabricated into typical OLETs using thermal evaporated gold electrodes (70 nm thickness) with 20 µm channel length and 1000 µm channel width, and show a maximum power conversion efficiency of 0.002-0.005 Cd/A, an external quantum efficiency of 10-3, and a brightness <1000 Cd/m2 at supply and driving voltages of 150 V. Zwitteronic electron injection layers have also been developed for MEH-PPV OLEDs with a maximum power conversion efficiency of 1.1 Cd/A, and a brightness >12,000 Cd/m2. (See, e.g., H. P. Li, Y. Xu, 2009; and H. P. Li, Y. Xu, and G. C. Bazan, 2009, cited above.) VPLETs were also fabricated with LiF as a dielectric layer between two Al electrodes showing gate modulation, but no detailed information was provided on the VPLET's characterization. (See, e.g., Z. Xu, S. H. Li, L. Ma, G. Li and Y. Yang 2007, cited above.)

Figure 9A:
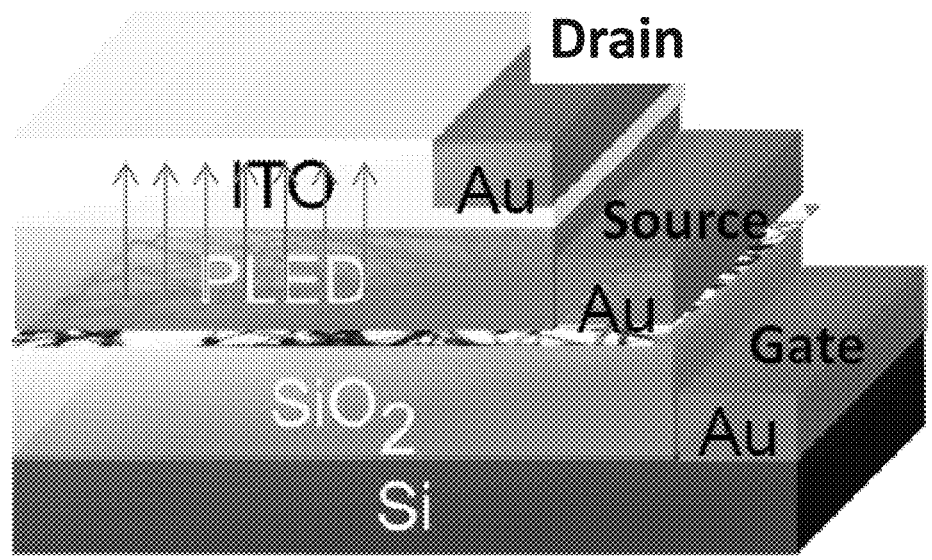
FIG. 9a provides a schematic diagram of a Ag NW enabled vertical polymer light emitting transistor with an ITO electrode on silicon wafer in accordance with embodiments of the invention.
Figure 9B:
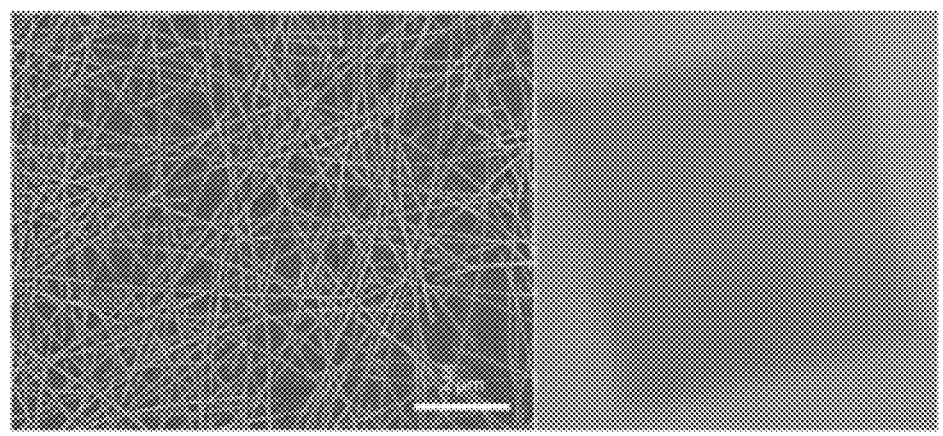
FIG. 9b provides an SEM of a Ag NW network on a Si wafer (left) and an image of the printed MEH-PPV polymer (right) of the vertical polymer light emitting transistor of FIG. 9a in accordance with embodiments of the invention.

As shown in FIG. 9*a*, in this exemplary embodiment, a printed Ag NW enabled VPLET is proposed comprised of printed Ag NW networks as a porous conductive Source electrode, LEPs (blue: PFO, green: super yellow, red: MEH-PPV) as channel materials (PLED), PEDOT/PSS coated ITO as a Drain electrode, and SiO$_2$ as the dielectric layer for gate modulation. Using aerosol jet printing, uniform and thin-layer Ag NW networks and 200 nm LEPs (blue: PFO, green: super-yellow, red: MEH-PPV) may be printed in various substrates. The sheet resistance of printed Ag NW networks is about 15 Ω/sq. Its SEM image is shown in FIG. 9*b*, exhibiting great uniformity. The porous structure of Ag NW networks permits the direct contact between LEPs and SiO$_2$ dielectric layer. FIG. 9*b* also shows a photograph of a printed MEH-PPV polymer with a uniform surface that is essential for organic devices. In this embodiment, by laminating PEDOT/PSS coated ITO with printed MEH-PPV on Silicon wafer, Ag NW enabled VPLETs with an ITO electrode on silicon wafer may be fabricated. Alternatively, printed Ag NW networks can be laminated with MEH-PPV fabricated on ITO by slight pressing and thermal treatment. To improve the performance of Ag NW enabled VPLETs, it is also possible to coat the SiO$_2$ layer with octyltriethoxysiliane (OTS) to improve the gate modulation and treating Ag NW network with CPE or polyethylimine (PEI) to enhance electron injection. The printed Ag NW enabled VPLETs may be characterized in a glovebox using a Keithley 4200 Semiconductor Characterization System (SCS). Using such process it is possible to fabricate Ag NW enabled VPLETs with characteristics outperforming those of PLEDs, with low supply and driving voltages, and full aperture ratio.

Example 3

Printing Ag NW Enabled VPLETs with Ag NW Electrode on Si Wafer

In another embodiment, an aerosol jet printing technique is provided for printing Ag NW on flexible plastics such as polyethylene terephthalate (PET) to fabricate flexible transparent porous conductive electrodes. Printing uniform Ag NW on PET allows one to replace ITO. In a particular embodiment, printed Ag NW porous conductive electrodes will be spin-coated with PEDOT/PSS and then will be laminated with printed LEPs on Ag NW covered silicon wafer to achieve Ag NW enabled VPLETs with a Ag NW electrode on silicon wafer. Alternatively, it is possible to use the Ag NW stretchable electrode fabrication method described above. In one such method Ag NW is printed on the top of a substrate such as glass, and then in-situ polymerization is performed atop the Ag NW networks. The peeled-off polymer films are porous, transparent and conductive with the embedded Ag NWs.

Figure 10A:
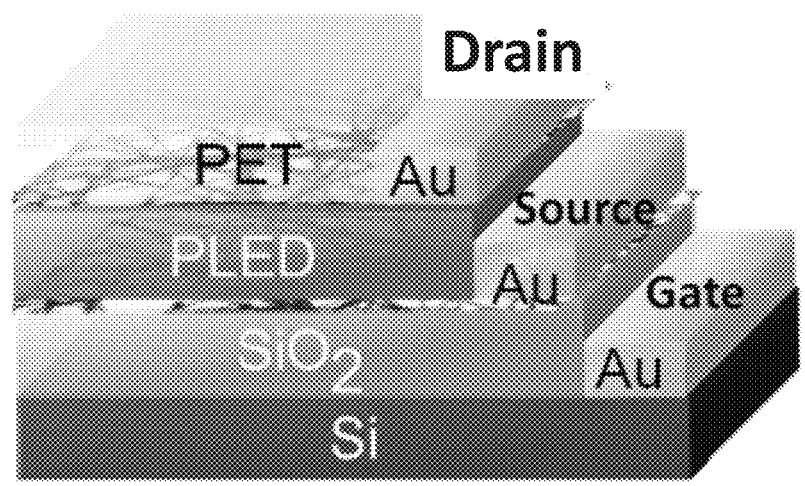
FIG. 10a provides a schematic diagram of a Ag NW enabled vertical polymer light emitting transistor with a Ag NW/PET electrode on silicon wafer in accordance with embodiments of the invention.
Figure 10B:
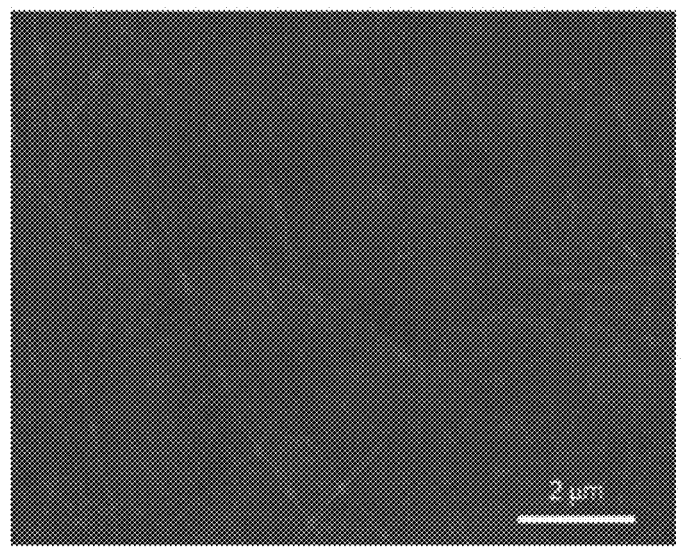
FIG. 10b provides an SEM of a Ag NW/PET electrode of FIG. 10a in accordance with embodiments of the invention.

As shown in FIGS. 10a and 10b, in this embodiment Ag NW networks are printed on PET plastic. The sheet resistance and transmittance of printed Ag NW electrodes are 15 $\Omega$/sq and 90%, respectively. The SEM image (FIG. 10b) shows good uniformity and consistency. Following the lamination method in Example 1, the printed Ag NW porous conductive electrodes can be laminated with printed LEPs on Ag NW network covered silicon wafer with the assistance of pressure and heating. LEPs can also be printed on Ag NW porous conductive electrodes and laminated with printed Ag NW on silicon wafer. Also, on the top of the printed LEPs on Ag NW covered silicon wafer, Ag NWs can be further printed to fabricate fully printed Ag NW enabled VPLETs with Ag NW porous conductive electrode on silicon wafer, as shown schematically in FIG. 10a. To achieve better performance, the silicon wafer may be treated with OTS, and the printed silver NW electrodes may be treated with CPE or PEI. As before, the fabricated devices may be characterized with a Keithley 4200 SCS in a glovebox having a $N_2$ atmosphere. The characteristics of Ag NW enabled VPLETs with Ag NW porous conductive electrode on silicon wafer are anticipated to be similar to those of Ag NW enabled VPLETs with ITO electrode on silicon wafer, but much better than those of PLEDs with Ag NW porous conductive electrodes. In particular, it is anticipated that the Ag NW porous conductive electrodes will have transmittance and conductivity greater than ITO.

Example 4

Printing Singly-Gated Ag NW Enabled VPLETs with Ag NW Electrode on Ionic Gel Coated Ag NW Substrate In yet another exemplary embodiment, methods for replacing silicon wafer with Ag NW porous conductive electrodes and a PS-PMMA-PS/EMIM TFSI ionic gel dielectric layer are disclosed. Of particular note in this embodiment is the requirement to print a second layer of Ag NW networks on the top of PS-PMMA-PS/EMIM TFSI ionic gel. One of the critical issues in such a device is the problem of short currents between the two layers of Ag NW networks. One method of addressing this issue is to embed Ag NW networks with PS-PMMA-PS/EMIM TFSI ionic gel, and then laminate ionic gel imbedded Ag NW networks with Ag NW electrodes (Ag NW networks imbedded in polymer films). LEPs will then be printed on the fabricated Ag NW networks atop the PS-PMMA-PS/EMIM TFSI ionic gel on Ag NW electrode, and then be laminated with PEDOT/PSS coated Ag NW electrode to form printed singly-gated Ag NW enabled VPLETs with Ag NW electrode on PS-PMMA-PS/EMIM TFSI ionic gel coated Ag NW substrate.

Figure 11:
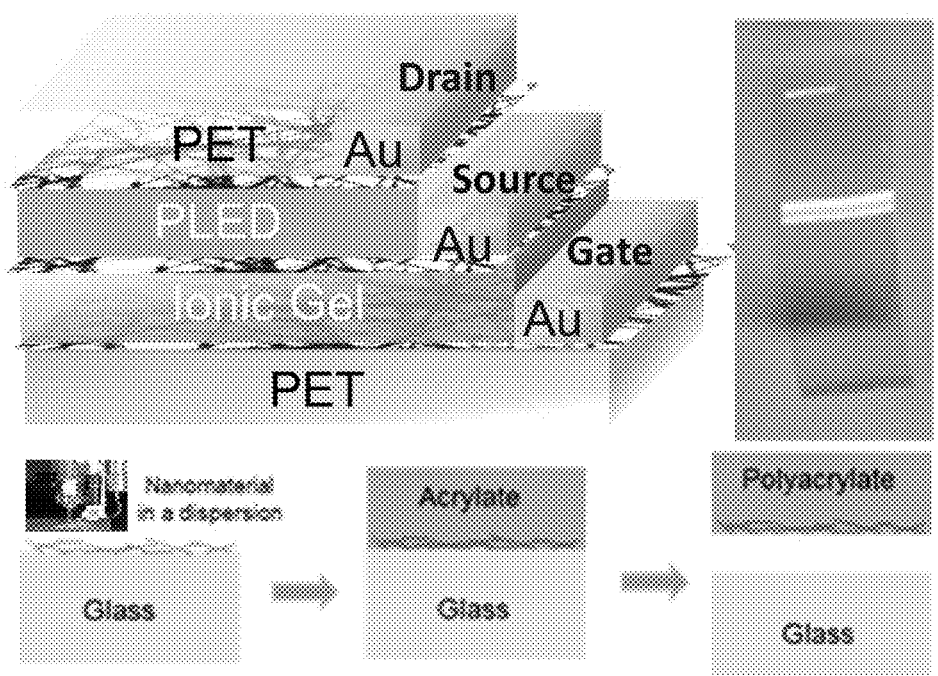
FIG. 11 provides a schematic diagram of a singly-gated Ag NW enabled vertical polymer light emitting transistor with flexible electrodes, and a process diagram for its manufacture in accordance with embodiments of the invention.

As shown in FIG. 11, in this embodiment a printing technique is used to print a PS-PMMA-PS/EMIM TFSI ionic gel on the top of printed Ag NW porous conductive electrodes and further print Ag NW networks to fabricate Ag NW networks sandwiched ionic gel dielectric layers. LEPs may then be printed on the Ag NW porous conductive electrodes or on the Ag NW porous conductive electrodes sandwiched ionic gel and laminated with Ag NW electrodes sandwiched ionic gel or Ag NW electrodes to achieve singly gated Ag NW enabled VPLETs with a Ag NW electrode on ionic gel coated Ag NW substrate.

As discussed above, the major challenge to such a printed Ag NW porous conductive electrode sandwiched PS-PMMA-PS/EMIM TFSI ionic gel device is cross connection between the two Ag NW porous conductive electrodes, and also in controlling the thickness of PS-PMMA-PS/EMIM TFSI ionic gel. Material diffusion, printing parameter optimization, baking thermal budgets and material stability parameters are key concerns. To address this challenge it is possible to use Ag NW electrodes in which the Ag NW networks are embedded in in-situ polymerized transparent plastics. (See, e.g., J. Liang, et al., Nature Photonics, vol. 7, pp. 817-824, 2013, the disclosure of which is incorporated herein by reference.) In some such embodiments, Ag NW networks will be printed on glass slides, and will be coated with the mixture solution of a siliconized urethane acrylate oligomer (UA) and an ethoxylated bisphenol A dimethacrylate (EBA). The mixture solution will be in-situ polymerized to form transparent films. After peeling the film off glass slide, the transparent conductive Ag NW electrode is characterized to be of 90% transmittance and 15 $\Omega$/sq sheet resistance with Ag NW networks embedded in the film (FIG. 8). UA and EBA are chosen for the high transparency and excellent stretchability of the homopolymer of UA and the good bonding force between the homopolymer of EBA and AgNWs, although other suitable materials may also be used.

FIG. 11 exhibits the obtained transparent conductive Ag NW PUA film. As shown, a PS-PMMA-PS/EMIM TFSI ionic gel will be printed on the fabricated Ag NW transparent conductive film (TCF) to act as the dielectric layer. PS-PMMA-PS/EMIM TFSI has demonstrated high conductance from P3HT (poly(3-hexylthiophene)) TFTs for driving OLEDs at 4 V support voltage and sub-1 V driving voltage. (See, e.g., J. H. Cho, et al., Nature Materials, vol. 7, pp. 900-906, 2008; Y. Xia, et al., Advanced Functional Materials, vol. 20, pp. 587-594, 2010; and D. Braga, et al., Advanced Functional Materials, vol. 22, pp. 1623-1631, 2012, the disclosures of which are incorporated herein by reference.) The ionic liquid can penetrate into the active layer, which will behave as a light emitting electrochemical cell (LEC). (See, e.g., Q. Pei, et al., Science, vol. 269, pp. 1086-1088, 1995, the disclosure of which is incorporated herein by reference.) Printed PS-PMMA-PS/EMIM TFSI ionic gel on Ag NW TCF will be stacked on printed Ag NW networks on a glass slide. After drying PS-PMMA-PS/EMIM TFSI ionic gel, Ag NW TCF will be peeled off from the glass slide to obtain a Ag NW electrodes sandwiched ionic gel. PEDOT/PSS will be printed on another fabricated Ag NW transparent conductive film. After drying a PEDOT/PSS coated Ag NW film under vacuum, 200 nm thick LEPs (blue: PFO, green: super-yellow, red: MEH-PPV) will be printed to serve as the active layers.

By laminating a Ag NW electrodes sandwiched ionic gel with printed LEPs on a Ag NW electrode, singly-gated Ag NW enabled VPLETs with Ag NW electrode on ionic gel covered Ag NW substrate will be achieved (as shown in the process diagram of FIG. 11). The obtained devices may be characterized in a glovebox with a Keithley 4200 SCS, and are anticipated to have a maximum external efficiency >5%, a brightness >10,000 Cd/m2, and a full aperture ratio at 4 V supply voltage and sub-1 V driving voltage. Further, with >90% transmittance in the Ag NW electrodes, the light can emit from both the top and bottom of the device with full aperture.

Example 5

Printing Doubly-Gated Ag NW Enabled VPLETs with Ag NW Electrode on Ionic Gel Coated Ag NW Substrate In still yet another embodiment, method and devices for printed doubly-gated Ag NW enabled VPLETs with Ag NW electrode on ionic gel gated Ag NW substrate are provided. In particular embodiments laminating Ag NW embedded PS-PMMA-PS/EMIM TFSI ionic gel atop of Ag NW electrode with printed LEPs on Ag NW embedded PS-PMMA-PS/EMIM TFSI ionic gel atop of Ag NW substrate are used to achieve doubly-gated Ag NW enabled VPLETs with a Ag NW electrode on ionic gel coated Ag NW substrate. Many of the same technical challenges arise as with Example 4. The advantage is that, in addition to low power, low voltage and high aperture ratio advantages, with doubly-gated Ag NW enabled VPLETs by PS-PMMA-PS/EMIM TFSI ionic gel, the charge carrier can be controlled with the two gate electrodes to reach the best performance without the requirement of adding additional transistors.

Figure 12:
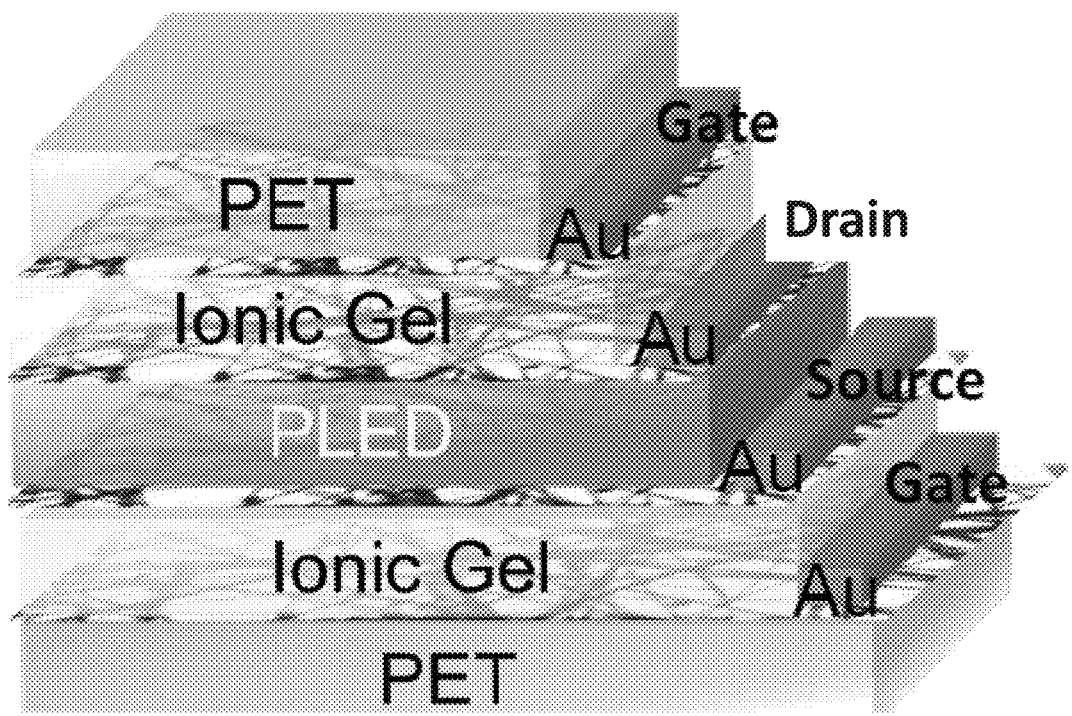
FIG. 12 provides a schematic diagram of a doubly-gated Ag NW enabled vertical polymer light emitting transistor with flexible electrodes in accordance with embodiments of the invention.

As shown in FIG. 12, embodiments of these doubly gated devices are based on printing Ag NW electrode sandwiched PS-PMMA-PS/EMIM TFSI ionic gels, such as are describe in detail in Example 4, above. In some embodiments, on one Ag NW electrodes sandwiched PS-PMMA-PS/EMIM TFSI ionic gel, 200 nm thick LEPs are also printed and laminated with another Ag NW electrodes sandwiched PS-PMMA-PS/EMIM TFSI ionic gel to obtain doubly-gated Ag NW enabled VPLETs with Ag NW electrodes on ionic gel coated Ag NW substrate (as shown in FIG. 12). By adjusting the charge carrier from the top and bottom Ag NW electrodes, the transportation, injection and recombination of charge carriers can be controlled to reach the charge carrier balance for the maximum efficiency and brightness. As in the singly-gated Ag NW enabled VPLETs, doubly-gated Ag NW enabled VPLETs are expected to have >5% external efficiency, >10,000 Cd/m2 brightness, and a full aperture ratio at 4V supply voltage and sub-1 driving voltage when characterized in a glovebox with a Keithley 4200 SCS.

Example 6

VLET Displays

Figure 13:
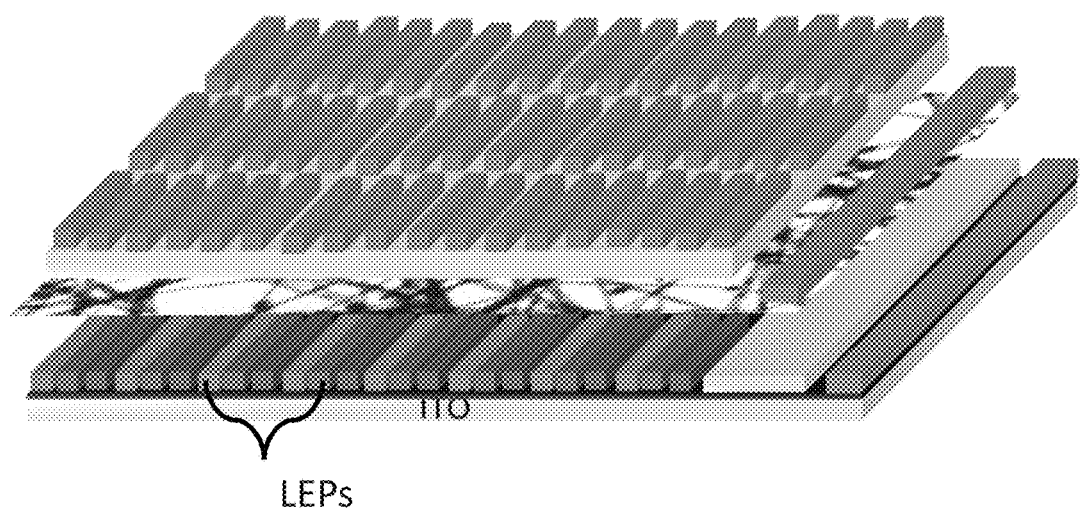
FIG. 13 provides a schematic diagram of a VLET display on ITO in accordance with embodiments of the invention.

Finally, although the above exemplary embodiments and discussion has focused on methods, architectures and structures for individual devices, it will be understood that the same architectures and structures may be combined as pixels into a VLET display device as shown schematically in FIG. 13. In such an embodiment, a plurality of VLETs as described herein may be combined and interconnected as is well-known by those skilled in the art, such as by electronically coupling the VLETs into addressing electrode lines, to form a TFT-backplane for a display, such as an AMOLED display.

SUMMARY

The market desire for high quality, large-size and low-cost displays are driving a need for improved display products. The current disclosure provides embodiments describing, among other things:

Simple, scalable, reproducible, and environmental robust techniques for printing porous conductive electrodes, semiconducting channel (LEPs), and organic gating materials;

Printed porous conductive electrode enabled vertical polymer light emitting transistors on silicon wafer with high conductance at lower power and low voltage;

Printed transparent porous conductive electrodes from NW films;

Singly-gated or doubly-gated porous conductive electrode enabled vertical polymer light emitting transistors with porous conductive electrodes on PS-PMMA-PS/EMIM TFSI ionic gel coated NW substrate to achieve >5% external efficiency, 10,000 Cd/m2 brightness and full aperture at 4 V supply voltage and sub 1 V driving voltage.

The vertical structure, porous conductive electrodes (such as, for example, Ag NW networks), and high capacitance of dielectric materials described herein remarkably improve the performances of VPLETs such that they are superior to current AMOLED combinations. Moreover, embodiments directed to spin-coating, aerosol jet printing technologies to implement printing LEPs, porous conductive electrodes, and dielectric materials for VPLET devices utilize the innovative direct-write and aerodynamic focusing technology to produce high resolution features down to 10 µm on non-planar substrates without the need for the masks or other high cost techniques. The spin-coating/printing technologies also reduce the manufacturing cost and environmental impact, and increases fabrication size with high throughput. Printed porous conductive electrodes (e.g., Ag NW) enabled VPLETs are expected to operate at low supply voltage (<4V) and sub-1V driving voltage with negligible signal delay (<50 µs), to generate enormous contrast ratio and power savings. In addition, printed porous conductive electrodes (e.g., Ag NW) enabled VPLETs on flexible substrates can expedite a shift to printed flexible devices.

DOCTRINE OF EQUIVALENTS

Having described several embodiments, it will be recognized by those skilled in the art that various modifications, alternative constructions, and equivalents may be used without departing from the spirit of the invention. Additionally, a number of well-known processes and elements have not been described in order to avoid unnecessarily obscuring the present invention. Accordingly, the above description should not be taken as limiting the scope of the invention.

Those skilled in the art will appreciate that the presently disclosed embodiments teach by way of example and not by limitation. Therefore, the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall there between.

What is claimed is:

1. A method to form vertical light emitting transistors, comprising:

forming a light emitting layer formed of at least one light emitting material, the light emitting layer having first and second sides;

forming at least one of a conductive drain electrode and a conductive source electrode in conductive relation with at least one side of said light emitting layer;

forming a least one capacitor comprised of a dielectric layer formed of at least one dielectric material, the at least one dielectric layer having first and second sides in conductive relation to one of either the conductive source or drain electrodes, and a conductive gate electrode;

encapsulating the formed layers using one of either a glass or barrier film; and wherein at least the electrode disposed between the light emitting layer and the dielectric layer is a conductive porous electrode that has sufficient open portions to exhibit a surface coverage of no greater than 50%, such that the dielectric layer makes direct contact with the light emitting layer through the open portions of the conductive porous electrode.

2. The method of claim 1, comprising one of the following combination of steps:

disposing the light emitting material atop a PEDOT coated ITO substrate, disposing one of either the drain or source electrode atop the light emitting layer, disposing the dielectric layer atop the one of either the drain or source electrode present atop the light emitting layer, and disposing the gate electrode atop the dielectric layer;

disposing a first dielectric layer atop a first gate electrode, disposing one of either the drain or source electrode atop the first dielectric layer, disposing the light emitting layer atop the one of either the drain or source electrode disposed atop the first dielectric layer, disposing one of either the drain or source electrode atop the light emitting layer; disposing a second dielectric layer over the one of either the drain or source electrode disposed atop the light emitting layer, and disposing a second gate electrode atop the second dielectric layer;

disposing the dielectric layer atop the gate electrode, disposing one of either the drain or source electrode atop the dielectric layer, and disposing the light emitting layer atop a PEDOT coated ITO substrate that is further laminated with the one of either the drain or source electrode which is disposed atop the dielectric layer; and disposing the dielectric layer atop the gate electrode, disposing one of either the drain or source electrode disposed atop the dielectric layer, disposing the light emitting layer atop the one of either the drain or source electrode disposed atop the dielectric layer, and disposing the light emitting layer that is laminated with the one of either the drain or source electrode not disposed atop the dielectric layer.

3. The method of claim 1, wherein the light emitting layer is formed by a deposition process selected from plasma enhanced chemical vapor deposition, low pressure chemical vapor deposition, molecular beam epitaxy, spin-coating, spray coating, aerosol jet printing, inkjet printing, screen printing, gravure printing, and flexograph printing.

4. The method of claim 3, further comprising thermal annealing the light emitting material in an inert atmosphere at a temperature range of from 60 to 140° C. for a duration of about 10 to 60 minutes.

5. The method of claim 3, wherein the light emitting layer is a conjugated polymer formed by spin-coating the conjugated polymer in an organic solution having a concentration of 1 to 10 mg/mL with a speed range from 800 to 5000 rpm followed by thermal annealing the conjugated polymer in an inert atmosphere at a temperature range of from 60 to 140° C. for a duration of about 10 to 60 minutes.

6. The method of claim 3, wherein the light emitting layer is a conjugated polymer formed by aerosol jet printing the conjugated polymer in an organic solution using a sheath gas flow of about 20 to 50 cubic centimeters per minute, a carrier gas flow of about 10 to 20 cubic centimeters per minute, a nozzle diameter of from about 60 to 300 μm, and an atomization selected from ultrasonic atomization at a voltage that ranges from about 20 to 48 V, and pneumatic atomization with an atomizer flow of about 600 cubic centimeters per minute, to generate an aerosol having a diameter of about 1 to 5 μm.

7. The method of claim 1, wherein at least one of the source, drain, and gate electrodes comprise a metal selected from Al, Au, Ag, Cu, Ni, Cr, Mo, and their combination formed by plasma enhanced chemical vapor deposition or low pressure chemical vapor deposition.

8. The method of claim 1, wherein the at least one conductive porous electrode is formed from a plurality of nanowires formed into one of the group of a random or patterned network of a plurality of metal or graphene nanowires, a nanowire metal mesh, a nanowire grid, a nanowire network encased within an elastomeric material, holey copper and holey graphene.

9. The method of claim 8, wherein the conductive porous electrode comprises a silver nanowire network with a surface coverage less than 10%, a sheet resistance less than 100 Ω/sq, and a transmission greater than 75%, and is formed by a process selected from spin-coating, spray coating, aerosol jet printing, inkjet printing, screen printing, gravure printing, and flexograph printing the silver nanowire network followed by thermal annealing the silver nanowire network in an inert environment at a temperature range of from about 60 to 160° C. for a duration of about 10 to 60 minutes, and washing the silver nanowire network with isopropanol.

10. The method of claim 9, wherein the conductive porous electrode is formed by spin-coating a Ag nanowire isopropanol solution with a concentration range of from about 0.1 mg/mL to 10 mg/mL with a spinning speed range of from about 800 to 5000 rpm, and repeating said spin-coating from about 1 to 20 times.

* * * * *